United States Patent
Analui et al.

(10) Patent No.: US 9,871,543 B2
(45) Date of Patent: Jan. 16, 2018

(54) MINIATURE ACOUSTIC RESONATOR-BASED FILTERS AND DUPLEXERS WITH CANCELLATION METHODOLOGY

(71) Applicant: UNIVERSITY OF SOUTHERN CALIFORNIA, Los Angeles, CA (US)

(72) Inventors: Behnam Analui, Irvine, CA (US); Ankush Goel, San Jose, CA (US); Hossein Hashemi, Pacific Palisades, CA (US)

(73) Assignee: University of Southern California, Los Angeles, CA (US)

( * ) Notice: Subject to any disclaimer, the term of this patent is extended or adjusted under 35 U.S.C. 154(b) by 0 days.

(21) Appl. No.: 14/626,572

(22) Filed: Feb. 19, 2015

(65) Prior Publication Data

US 2015/0236390 A1  Aug. 20, 2015

Related U.S. Application Data

(60) Provisional application No. 61/941,702, filed on Feb. 19, 2014.

(51) Int. Cl.
  *H03H 9/25* (2006.01)
  *H04B 1/12* (2006.01)
  (Continued)

(52) U.S. Cl.
  CPC .............. *H04B 1/123* (2013.01); *H03H 9/547* (2013.01); *H03H 9/6403* (2013.01);
  (Continued)

(58) Field of Classification Search
  CPC . H04B 1/52; H04B 1/44; H04B 1/525; H04B 1/0057; H04B 1/48; H04B 1/123;
  (Continued)

(56) References Cited

U.S. PATENT DOCUMENTS 2,561,212 A  7/1951 Lewis
4,464,675 A  8/1984 Balaban et al.
(Continued)

FOREIGN PATENT DOCUMENTS

DE  102012107877 A1  2/2014
EP  1091497 A1  4/2001
(Continued)

OTHER PUBLICATIONS

Hunter, I.C. et al. 2005. Passive Microwave Receive Filter Networks Using Low-Q Resonators. IEEE Microwave Magazine, Sep. 2005, pp. 46-53.
(Continued)

*Primary Examiner* — Sophia Vlahos
(74) *Attorney, Agent, or Firm* — Brooks Kushman P.C.

(57) ABSTRACT

A cancellation-based filter may have at least one frequency pass band and at least one frequency stop band. The cancellation-based filter may include a first group of one or more band pass filters, each having at least one acoustic resonator, the first group providing at least one frequency pass band for the cancellation-based filter; at least one hybrid coupler; and a second group of one or more band pass filters, each having at least one acoustic resonator, the second group coupled to at least one of the at least one hybrid couplers, wherein the at least one hybrid coupler and the second group of one or more band pass filters interact to provide at least one frequency stop band for the cancellation-based filter.

19 Claims, 17 Drawing Sheets

(51) Int. Cl.
*H03H 9/54* (2006.01)
*H03H 9/64* (2006.01)
*H03H 9/70* (2006.01)
*H03H 9/72* (2006.01)

(52) U.S. Cl.
CPC .......... *H03H 9/6409* (2013.01); *H03H 9/706* (2013.01); *H03H 9/725* (2013.01)

(58) Field of Classification Search
CPC .. H03H 7/48; H03H 2007/013; H03H 7/0138; H03H 7/0161; H03H 9/547; H03H 9/6403; H03H 9/6409; H03H 9/725; H03H 9/706; H04L 5/14; G01S 7/03
See application file for complete search history.

(56) References Cited

U.S. PATENT DOCUMENTS

| | | | |
|---|---|---|---|
| 4,694,266 A | 9/1987 | Wright | |
| 4,963,945 A | 10/1990 | Cooper et al. | |
| 4,968,967 A | 11/1990 | Stove | |
| 5,483,248 A | 1/1996 | Milroy | |
| 5,493,246 A | 2/1996 | Anderson | |
| 5,691,978 A | 11/1997 | Kenworthy | |
| 6,194,980 B1 | 2/2001 | Thon | |
| 6,229,992 B1 | 5/2001 | McGeehan et al. | |
| 6,496,061 B1* | 12/2002 | Bloom | H03F 3/602 330/124 R |
| 6,721,544 B1 | 4/2004 | Franca-Neto | |
| 6,819,302 B2 | 11/2004 | Volman | |
| 7,072,614 B1 | 7/2006 | Kasperkovitz | |
| 7,116,966 B2* | 10/2006 | Hattori et al. | |
| 7,123,883 B2 | 10/2006 | Mages | |
| 7,250,830 B2* | 7/2007 | Layne et al. ................. 333/132 |
| 7,283,793 B1 | 10/2007 | McKay | |
| 7,330,500 B2 | 2/2008 | Kouki | |
| 7,623,005 B2* | 11/2009 | Johansson et al. ........... 333/110 |
| 7,633,435 B2 | 12/2009 | Meharry et al. | |
| 7,711,329 B2 | 5/2010 | Aparin et al. | |
| 7,804,383 B2 | 9/2010 | Volatier et al. | |
| 7,894,779 B2 | 2/2011 | Meiyappan et al. | |
| 8,013,690 B2 | 9/2011 | Miyashiro | |
| 8,135,348 B2 | 3/2012 | Aparin | |
| 8,149,742 B1* | 4/2012 | Sorsby | H04B 1/0057 370/219 |
| 8,199,681 B2 | 6/2012 | Zinser et al. | |
| 8,385,871 B2 | 2/2013 | Wyville | |
| 8,422,412 B2 | 4/2013 | Hahn | |
| 8,514,035 B2 | 8/2013 | Mikhemar et al. | |
| 8,600,329 B1 | 12/2013 | Comeau et al. | |
| 8,749,321 B2* | 6/2014 | Kim | H01P 1/20 333/202 |
| 9,543,630 B2 | 1/2017 | Tokumitsu | |
| 2002/0089396 A1* | 7/2002 | Noguchi | H03H 9/6483 333/193 |
| 2003/0109077 A1* | 6/2003 | Kim | H01L 21/561 438/106 |
| 2004/0000425 A1* | 1/2004 | White et al. ................. 174/250 |
| 2004/0127178 A1 | 7/2004 | Kuffner | |
| 2004/0180633 A1 | 9/2004 | Nakatani et al. | |
| 2005/0070232 A1 | 3/2005 | Mages | |
| 2005/0289632 A1 | 12/2005 | Brooks | |
| 2007/0105509 A1 | 5/2007 | Muhammad et al. | |
| 2008/0128901 A1 | 6/2008 | Zurcher et al. | |
| 2008/0227409 A1 | 9/2008 | Chang et al. | |
| 2008/0261519 A1 | 10/2008 | Demarco et al. | |
| 2009/0054008 A1 | 2/2009 | Satou | |
| 2009/0121797 A1 | 5/2009 | Karabatsos | |
| 2009/0125253 A1 | 5/2009 | Blair et al. | |
| 2009/0252252 A1 | 10/2009 | Kim et al. | |
| 2009/0289744 A1 | 11/2009 | Miyashiro | |
| 2010/0002620 A1 | 1/2010 | Proctor, Jr. et al. | |
| 2010/0084146 A1 | 4/2010 | Roberts | |
| 2010/0127795 A1 | 5/2010 | Bauer et al. | |
| 2010/0134700 A1* | 6/2010 | Robert | H03H 7/01 348/731 |
| 2010/0148886 A1* | 6/2010 | Inoue | H01P 1/213 333/132 |
| 2010/0177917 A1 | 7/2010 | Van Der Werf | |
| 2010/0323654 A1 | 12/2010 | Judson et al. | |
| 2011/0069644 A1* | 3/2011 | Kim et al. ................. 370/278 |
| 2011/0080229 A1* | 4/2011 | Kenington | H03H 2/00 333/126 |
| 2011/0080856 A1 | 4/2011 | Kenington | |
| 2011/0134810 A1 | 6/2011 | Yamamoto et al. | |
| 2011/0140803 A1 | 6/2011 | Kim et al. | |
| 2011/0227664 A1 | 9/2011 | Wyville | |
| 2012/0007605 A1 | 1/2012 | Benedikt | |
| 2012/0063496 A1 | 3/2012 | Giannini et al. | |
| 2012/0140860 A1 | 6/2012 | Rimini et al. | |
| 2012/0154071 A1* | 6/2012 | Bradley et al. ............. 333/133 |
| 2012/0163245 A1 | 6/2012 | Tone et al. | |
| 2012/0161784 A1 | 8/2012 | Zhang et al. | |
| 2012/0194269 A1 | 8/2012 | Schlager et al. | |
| 2012/0201153 A1 | 8/2012 | Bharadia et al. | |
| 2012/0201173 A1 | 8/2012 | Jain et al. | |
| 2012/0212304 A1 | 8/2012 | Zhang et al. | |
| 2012/0230227 A1 | 9/2012 | Weiss | |
| 2013/0016634 A1 | 1/2013 | Smiley | |
| 2013/0063299 A1 | 3/2013 | Proudkii | |
| 2013/0083703 A1 | 4/2013 | Granger-Jones et al. | |
| 2013/0109330 A1 | 5/2013 | Sahota et al. | |
| 2013/0113576 A1* | 5/2013 | Inoue | H03H 9/6433 333/133 |
| 2013/0130619 A1 | 5/2013 | Harverson et al. | |
| 2013/0154887 A1 | 6/2013 | Hein et al. | |
| 2013/0201880 A1 | 8/2013 | Bauder et al. | |
| 2013/0201881 A1 | 8/2013 | Bauder et al. | |
| 2013/0201882 A1* | 8/2013 | Bauder | H03H 7/48 370/277 |
| 2013/0241655 A1 | 9/2013 | Liss et al. | |
| 2013/0241669 A1 | 9/2013 | Mikhemar et al. | |
| 2013/0242809 A1 | 9/2013 | Tone et al. | |
| 2013/0321097 A1* | 12/2013 | Khlat | H04B 1/0057 333/117 |
| 2014/0140860 A1 | 5/2014 | Tibbott et al. | |
| 2014/0169236 A1 | 6/2014 | Choi et al. | |
| 2014/0194073 A1 | 7/2014 | Wyville et al. | |
| 2014/0204808 A1 | 7/2014 | Choi et al. | |
| 2014/0376419 A1 | 12/2014 | Goel et al. | |
| 2015/0118978 A1* | 4/2015 | Khlat ............................. 455/83 |
| 2015/0163044 A1 | 6/2015 | Analui et al. | |
| 2015/0236395 A1 | 8/2015 | Analui | |
| 2015/0236842 A1 | 8/2015 | Goel | |
| 2017/0030339 A1 | 2/2017 | Proudfoot | |

FOREIGN PATENT DOCUMENTS

| | | | | |
|---|---|---|---|---|
| EP | 2733855 A1 | 5/2014 | | |
| EP | 2814172 | * 12/2014 | ............... | H03H 7/06 |
| EP | 2960981 A1 | * 12/2015 | ............... | H04N 1/16 |
| KR | 10-2010-0134324 | * 12/2010 | | |
| WO | WO 95/15018 A1 | 6/1995 | | |
| WO | WO 2014/032883 | * 3/2014 | ............... | H04B 1/52 |
| WO | WO2014133625 A2 | 9/2014 | | |
| WO | WO2015089092 A1 | 6/2015 | | |

OTHER PUBLICATIONS

Kannangara, S. et al. 2007. Analysis of an Adaptive Wideband Duplexer With Double-Loop Cancellation. IEEE Transactions on Vehicular Technology, vol. 56, No. 4, pp. 1761-1982, Jul. 2007.
Laforge, P.D. et al 2009. Diplexer design implementing highly miniaturized multilayer superconducting hybrids and filters. IEEE Transactions on Applied Superconductivity, Apr. 2009, pp. 47-54.
Marcatili, E.A. et al. 1961. Band-Splitting Filter. Bell System Technical Journal, Jan. 1961, pp. 197-212.
Matthaei, G. et al. 1980. Microwave Filters, Impedance-Matching Networks, and Coupling Structures, Chapter 14: Directional, Channel-Separation Filters and Traveling-Wave Ring-Resonators, pp. 843-888; Chapter 16: Multiplexer Design, pp. 965-1000. Copyright

(56) References Cited

OTHER PUBLICATIONS

1980 Artech House, Inc., Dedham, MA; reprint of edition published by McGraw-Hill Book Company, Inc., 1964.
Phudpong, P. et al. 2007. Nonlinear Matched Reflection Mode Bandstop Filters for Frequency Selective Limiting Applications. In Microwave Symposium Conference, 2007, IEEE/MTT-S International, 2007, pp. 1043-1046.
Korean International Searching Authority (ISA/KR). 2014. International Search Report and Written Opinion of the International Searching Authority, dated Sep. 23, 2014, for PCT Application PCT/US2013/074155, entitled "Passive Leakage Cancellation Networks for Duplexers and Coexisting Wireless Communication Systems," published as WO 2014/133625A1.
United States International Searching Authority (ISA/US). 2015. International Search Report and Written Opinion of the International Searching Authority, dated Mar. 3, 2015, for PCT Application PCT/US069372, entitled "Enhancing Isolation and Impedance Matching in Hybrid-Based Cancellation Networks and Duplexers," filed Dec. 9, 2014.
United States International Searching Authority (ISA/US). 2015. International Search Report and Written Opinion of the International Searching Authority, dated May 20, 2015, for PCT Application PCT/US2015/016145, entitled "Hybrid-Based Cancellation in Presence of Antenna Mismatch," filed Feb. 17, 2015.
United States International Searching Authority (ISA/US). 2015. International Search Report and Written Opinion of the International Searching Authority, dated May 27, 2015, for PCT Application PCT/US2015/015930, entitled "Reflection and Hybrid Reflection Filters," filed Feb. 13, 2015.
United States Patent and Trademark Office. 2015. Non-final Office Action, dated Jun. 15, 2015, for U.S. Appl. No. 14/102,244, filed Dec. 10, 2013, entitled "Passive Leakage Cancellation Networks for Duplexers and Coexisting Wireless Communication Systems," published Dec. 25, 2015 as US2014/0376419.
USPTO. 2015. Final Office Action for U.S. Appl. No. 14/102,244, dated Sep. 22, 2015, entitled "Passive Leakage Cancellation Networks for Duplexers and Coexisting Wireless Communication Systems," Goel et al., inventors, published Dec. 25, 2014 as US 2014/0376419 A1.
USPTO. 2016. Non-Final Office Action, dated May 20, 2016, for U.S. Appl. No. 14/622,627, entitled "Reflection and Hybrid Reflection Filters,".
European Patent Office (EPO). 2016. Extended European Search Report, dated Jul. 4, 2016, for European Application No. 13876498.2, entitled "Passive Leakage Cancellation Networks for Suplexers and Coexisting Wireless Communication Systems,".
USPTO. 2016. Notice of Allowance, dated Jul. 20, 2016, for U.S. Appl. No. 14/102,244, entitled "Passivle Leakage Cancellation Networks for Duplexers and Coexisting Wireless Communication Systems,".
Non-final Office Action dated Aug. 1, 2017 for U.S. Appl. No. 14/624,289, 32 pgs.
Non-final Office Action dated Aug. 1, 2017 for U.S. Appl. No. 14/624,289, filed Feb. 19, 2015 32 pgs.
Notice of Allowance dated Aug. 14, 2017 for U.S. Appl. No. 14/622,627, filed Feb. 13, 2015, 7 pgs.
United States International Searching Authority (ISA/US). 2015. International Search Report and Written Opinion of the International Searching Authority, dated Jun. 25, 2015, for PCT Application PCT/US2015/016642, entitled "Miniature Acoustic Resonator-Based Filters and Duplexers with Cancellation Methodology," filed Feb. 19, 2015.
Final Office Action dated Mar. 3, 2017 for U.S. Appl. No. 14/624,289, filed Feb. 17, 2015, 18 pgs.
Non-final Office Action dated Nov. 4, 2016, U.S. Appl. No. 14/624,289, filed Aug. 20, 2015, 56 pgs.
Notice of Allowance dated Nov. 4, 2016, U.S. Appl. No. 14/565,752, filed Dec. 10, 2014, 66 pgs.
Notice of Allowance dated Feb. 16, 2017 for U.S. Appl. No. 14/622,627, filed Feb. 13, 2015, 8 pgs.

* cited by examiner

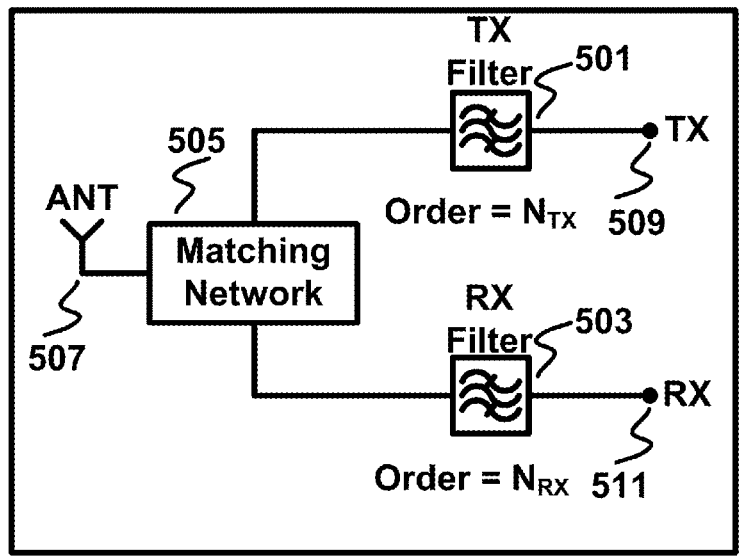
FIG. 5A (Prior Art)    # of resonators = $N_{TX}+N_{RX}$
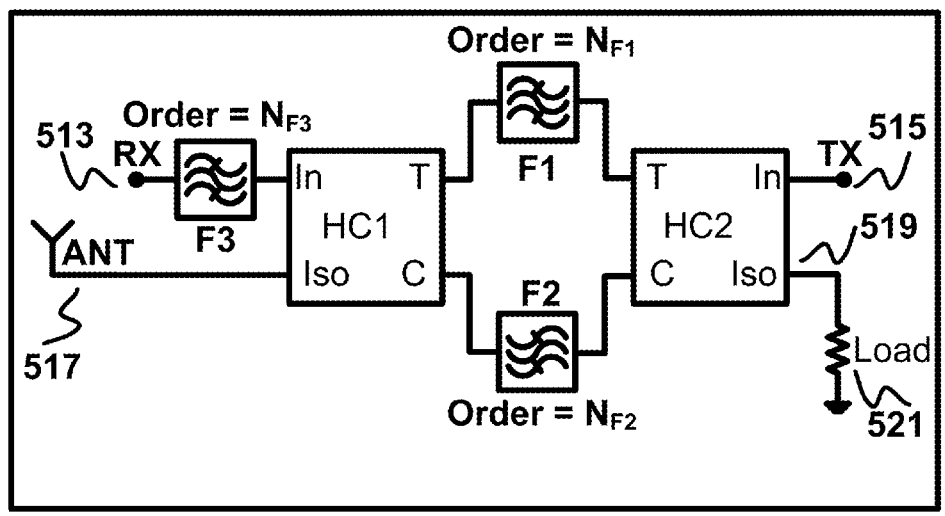
FIG. 5B    # of resonators = $N_{F1}+N_{F2}+N_{F3}$

MINIATURE ACOUSTIC RESONATOR-BASED FILTERS AND DUPLEXERS WITH CANCELLATION METHODOLOGY

CROSS-REFERENCE TO RELATED APPLICATION

This application is based upon and claims priority to U.S. provisional patent application 61/941,702, entitled "MINIATURE ACOUSTIC RESONATOR-BASED FILTERS AND DUPLEXERS WITH CANCELLATION METHODOLOGY," filed Feb. 19, 2014. The entire content of this application is incorporated herein by reference.

STATEMENT REGARDING FEDERALLY SPONSORED RESEARCH

This invention was made with Government support under Contract No. N00014-12-C-0130, awarded by the Office of Naval Research (ONR) and under Contract No. HR0011-12-C-0094, awarded by the Defense Advanced Research Projects Agency (DARPA). The Government has certain rights in the invention.

BACKGROUND

Technical Field

This disclosure relates to filters and duplexers that use acoustic resonators or components in cancellation architectures to achieve good performance for various communication systems and standards.

Description of Related Art

Radio frequency (RF) filters and duplexers have been essential components of communication systems. High selectivity, low insertion loss, compact size, ability to handle large signals (power handling), high linearity, manufacturability, and low cost may be some of the important desired features for RF filters and duplexers.

The requirements for RF filters and duplexers have become more stringent in light of new communication standards where information channels and frequency bands are closer to each other, new communication devices such as smartphones where the footprint and cost of all components must be very small as more components are needed in support of multiple standards and applications, and co-existent communication systems where multiple communication transmitters and receivers work simultaneously.

Linearity, noise, and power handling requirements typically lead to utilization of passive RF filters and duplexers in many applications. The performance of passive RF filters and duplexers may be limited by the quality factor (Q) of the components that are used in their realization. The filter selectivity as well as passband requirement may lead to a filter topology and filter order. For a given RF filter or duplexer topology and order, insertion loss may reduce with the increase of component Q.

Various technologies can be used to realize passive RF filters and duplexers. For instance, capacitors, inductors, or transmission lines can be used to realize passive RF filters and duplexers. Electromagnetic resonators, including waveguide resonators and dielectric resonators, can also be used to realize passive filters and duplexers. The quality factor of such components is typically proportional to their overall physical size. As such, it has been difficult to realize compact low-loss selective passive RF filters and duplexers using electromagnetic components and resonators.

Piezoelectric material can be used to realize compact high-Q resonators. Crystal resonators have been widely used to generate spectrally-pure oscillators. Surface acoustic wave (SAW) resonators have been widely used to realize compact low-loss selective RF filters and duplexers as well as oscillators. More recently, bulk acoustic wave (BAW) resonators have been used to construct high-performance RF filters and duplexers as well as oscillators. Ceramic resonators and micro electro mechanical system (MEMS) resonators with high quality factor have also been used in frequency generation as well as filtering applications.

RF SAW filters and duplexers have been used widely in wireless communications such as cellular phones, wireless local area network (WLAN) transceivers, global positioning system (GPS) receivers, cordless phones, and so forth. RF SAW filters have been used as band-select filters, image-reject filters, intermediate frequency (IF) filters, transmitter noise or spur reduction filters, and so forth. A typical smartphone may have several SAW resonators, SAW filters, and SAW duplexers to support various communication systems and standards.

Over the past decade, significant research and development on BAW technology has resulted in BAW resonators that have lower loss (or higher Q) or are more compact, especially at higher frequencies, compared with SAW resonators. Therefore, RF filters and duplexers that use BAW resonators may have lower insertion loss, or higher selectivity, or smaller form factor compared with those that utilize SAW resonators especially at higher frequencies. Thin film bulk acoustic resonators (FBAR) are a common example of BAW resonators.

Modern wireless communication standards designate many different operational frequency bands to support the increase in the overall wireless capacity and reach. For instance, cellular phone standards may include RF frequency bands that span around 700 MHz to around 4000 MHz. Furthermore, in order to increase the overall wireless capacity, the frequency spacing between adjacent frequency bands or channels within the same application or different applications may be reduced. This may be done, for instance, by reducing the typical guard bands in wireless standard or by placing the transmit and receive frequency bands in a frequency division duplex (FDD) scheme closer to each other. As a result, RF filters and duplexers with higher selectivity may be required. More selective RF filters and duplexers that utilize a given component or technology (SAW, BAW, etc.) may incur more in-band insertion loss. The higher RF filter or duplexer insertion loss may reduce the wireless receiver noise figure and sensitivity, increase the wireless transmitter power consumption or reduce the transmitted power, and/or deteriorate the overall performance of a communication system.

In commercial systems, the choice of technology may depend on the technical performance, such as power consumption as well as economic and business considerations such as cost, size, and time to market. For instance, while one technology may offer a better performance compared with another technology, it may not be adopted for a commercial system that is cost sensitive. In the case of RF filters and duplexers, it may be desirable to use a technology that leads to the lowest-cost and/or most-compact solution, as long as a predetermined performance criterion is met. In other words, a more expensive or larger solution may not be adopted, even if it offers a better performance as compared with an alternative solution that meets an acceptable performance level at a lower cost and/or size. For instance, while RF filters and duplexers that use BAW resonators may offer lower loss compared with RF filters and duplexers that use SAW resonators for a given set of specifications, the higher relative cost of BAW technology, as well as its relatively smaller number of suppliers, may disfavor their usage in certain applications and standards. Other considerations may be the ease of integration with the rest of the components in a communication system. For instance, there may be performance, business, or economic advantages to integrate RF filters and duplexers with low noise amplifiers (LNA), power amplifiers (PA), transmit/receive (T/R) or band-select switches, impedance matching networks, etc.

It may be desirable to realize selective low-loss compact passive RF filters and duplexers using technologies that are low cost and widely available. As stated before, given a filter topology and filter order, technologies that offer lower quality factor components may result in higher in band insertion loss. However, the filter topology can be modified to meet the desired set of specifications, without compromising the in-band insertion loss. For instance, a known unwanted out-of-band signal may be removed or reduced by using a band stop or notch filter, without necessarily increasing the order of an RF band pass filter (BPF). The source of this unwanted out-of-band signal may be a received interferers or blocker, jammer, transmitter in an FDD scheme, other co-existent communication devices. For instance, a WiFi transmitter can create unwanted signal for a cell phone receiver that is operating at a close-by frequency band within the same platform (smartphone). The undesired out-of-band signals may also be removed or reduced by using a feed-forward cancellation scheme in which an identical copy of the undesired signal is recreated and subtracted at the desired location.

As was mentioned previously, modern wireless communication standards designate many different operational frequency bands. Consequently, system complexity may significantly increase, since each of the frequency bands may require use of at least one RF filter. It may be desirable to reduce the complexity of such RF systems. One consideration is the use of a tunable RF filter that can replace many fixed frequency RF filters. However, conventional acoustic-based filters, such as SAW and BAW, may be not be tunable. Furthermore, tunable filters may be presented by combining acoustic resonators and tunable electromagnetic components, such as capacitors. However, these may still suffer from higher in-band insertion loss, lower rejection, lower isolation in case of a duplexer, or all of the above, compared to a modern commercial radio front-end system.

SUMMARY

A cancellation-based filter may have at least one frequency pass band and at least one frequency stop band. The cancellation-based filter may include a first group of one or more band pass filters, each having at least one acoustic resonator, the first group providing at least one frequency pass band for the cancellation-based filter; at least one hybrid coupler; and a second group of one or more band pass filters, each having at least one acoustic resonator, the second group coupled to at least one of the at least one hybrid couplers, wherein the at least one hybrid coupler and the second group of one or more band pass filters interact to provide at least one frequency stop band for the cancellation-based filter.

At least one of the at least one frequency pass bands may be tunable or reconfigurable in response to an electrical signal or a user-operated control.

At least one of the at least one frequency stop bands may be tunable or reconfigurable in response to an electrical signal or a user-operated control.

At least one of the band pass filters in the first group and at least one of the band pass filters in the second group may be on a common wafer.

At least one of the acoustic wave resonators may be a surface acoustic wave resonator or a bulk acoustic wave resonator.

At least one of the at least one hybrid couplers may be an integrated passive device.

At least one of the band pass filters in the first group, at least one of the band pass filters in the second group, and at least one of the at least one hybrid coupler may be on a common substrate.

At least one of the band pass filters in the first group or the second group may be stacked over or under at least one of the at least one hybrid couplers.

The first group may include only a single band pass filter that provides a single frequency pass band for the cancellation-based filter; the second group may include only a single band pass filter that provides a single frequency stop band for the cancellation-based filter; and the at least one hybrid coupler may include only a single hybrid coupler. The band pass filter in first group, the band pass filter in the second group, and the hybrid coupler may share the same substrate or be integrated in the same package.

The first and the second groups of band pass filters may be on a common wafer in a common package; the at least one hybrid coupler may be an integrated passive device; and the first and the second groups of band pass filters and the hybrid coupler may be on a common substrate or integrated in the same package.

A wireless communication system may include a transmitter that transmits in a transmitting frequency band or a receiver that receives in a receiving frequency band; and a cancellation-based filter of one of the types recited above. At least one of the frequency pass bands in the cancellation-based filter may substantially include the receiving frequency band or at least one of the frequency stop bands in the cancellation-based filter may substantially include the transmitting frequency band.

A wireless communication system may include a first transmitter that transmits in a transmitting frequency band; a second transmitter having a second transmitting frequency band; and a cancellation-based filter of one of the types recited above. At least one of the frequency pass bands in the cancellation-based filter may substantially include the first transmitting frequency band and at least one of the frequency stop bands in the cancellation-based filter may substantially include the second transmitting frequency band.

A wireless communication system may include a front end module. The front end module may include a cancellation-based filter of any of the types recited above; and at least one amplifier or one switch.

A cancellation-based duplexer with at least one transmit frequency band and at least one receive frequency band may include at least two hybrid couplers. The cancellation-based duplexer may include a first group of two or more band pass filters, each having at least one acoustic resonator. The first group may be coupled to at least two of the at least two hybrid couplers. The at least two hybrid couplers and the first group may interact to provide at least one transmit frequency band for the cancellation-based duplexer. The cancellation-based duplexer may include a second group of one or more band pass filters. Each may have at least one acoustic resonator. The second group may be coupled to at least one of the at least two hybrid couplers. The at least two hybrid couplers and the second group may interact to provide at least one receive frequency band for the cancellation-based duplexer.

The at least one transmit frequency pass band or the at least one receive frequency band may be tunable or reconfigurable in response to an electrical signal or a user-operated control.

At least two of the band pass filters in the first group may be on a common wafer.

At least one of the acoustic wave resonators may be a surface acoustic wave resonator or a bulk acoustic wave resonator.

At least one of the hybrid couplers may use is an integrated passive device.

At least one of the band pass filters in the first group, at least one of the band pass filters in the second group, and at least one of the hybrid couplers may be on a common substrate or integrated in the same package.

At least one of the band pass filters in the first group or the second group may be stacked over or under at least one of the at least two hybrid couplers.

At least two of the band pass filters in the first group, at least one of the band pass filters in the second group, and at least two of the at least two hybrid couplers may be on a common substrate The first group may include only two band pass filters that provide only one transmit frequency band. The second group may include only one band pass filter that provides only one receive frequency band. The at least two hybrid couplers may include only two hybrid couplers. At least one of the band pass filters may include at least one acoustic wave resonator. The cancellation-based duplexer may have as a tunable transfer function.

These, as well as other components, steps, features, objects, benefits, and advantages, will now become clear from a review of the following detailed description of illustrative embodiments, the accompanying drawings, and the claims.

BRIEF DESCRIPTION OF DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

Represented simulation results of various embodiments are only for illustrative reasons, and are not meant to cover all possible responses that various embodiments enable. For instance, the presented simulation results cover filters with a single passband and at least one stopband (or notch) in their transfer functions. Filters with multiple passbands or stopbands may also be realized using the embodiments or other teachings of this disclosure. Filters whose transfer functions fundamentally change as a function of at least one stimulus may also be realized using the embodiments or other teachings of this disclosure.

FIG. 5A shows an embodiment of a conventional duplexer design.

FIG. 5B shows an embodiment of a hybrid coupler based duplexer design which uses feed-forward hybrid cancellation to achieve enhanced isolation.

DETAILED DESCRIPTION OF ILLUSTRATIVE EMBODIMENTS

Illustrative embodiments are now described. Other embodiments may be used in addition or instead. Details that may be apparent to a person of ordinary skill in the art may have been omitted. Some embodiments may be practiced with additional components or steps and/or without all of the components or steps that are described.

A conventional method to design acoustic resonator based filters and duplexer is to decide upon the number of resonators to be used depending on the required stopband rejection in the case of filters or the required isolation in the case of duplexers. The larger the number of resonators used in filter design, the larger may be the order of the filter and the sharper may be the filter roll-off around passband. Sharper filter roll-off may mean higher stopband rejection. Similarly, the number of resonators used in the TX and RX filters of the duplexer may determine the total isolation from TX to RX. The larger the order of the TX and RX filters (i.e., the larger the number of resonators used in them), the larger may be the amount of isolation between TX and RX. Due to the limited quality factor of the acoustic resonators, the insertion loss in the filter and duplexer may be directly proportional to the number of the resonators used. In other words, the larger the order of the filter and the TX and RX filter, the larger may be the loss of the filter and duplexer, respectively. It may be possible to break this insertion loss and isolation or stopband rejection tradeoff by incorporating hybrid couplers in the design of filters and duplexers.

Figure 1A:
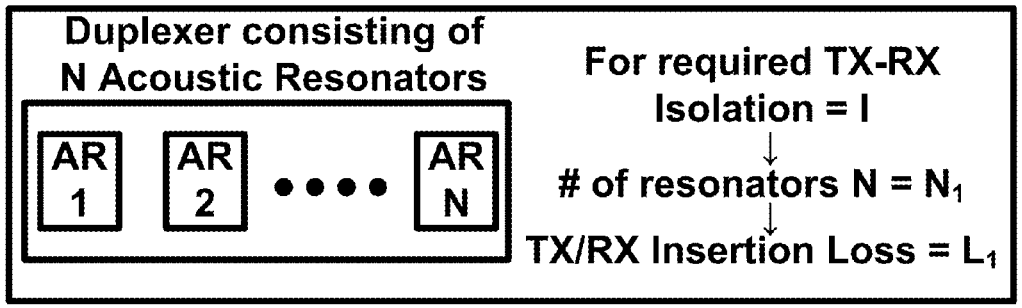
FIG. 1A illustrates a requirement for a minimum number of acoustic resonators (AR) that may be needed in a conventional duplexer design to meet a certain transmitter (TX) to receiver (RX) isolation.
Figure 1B:
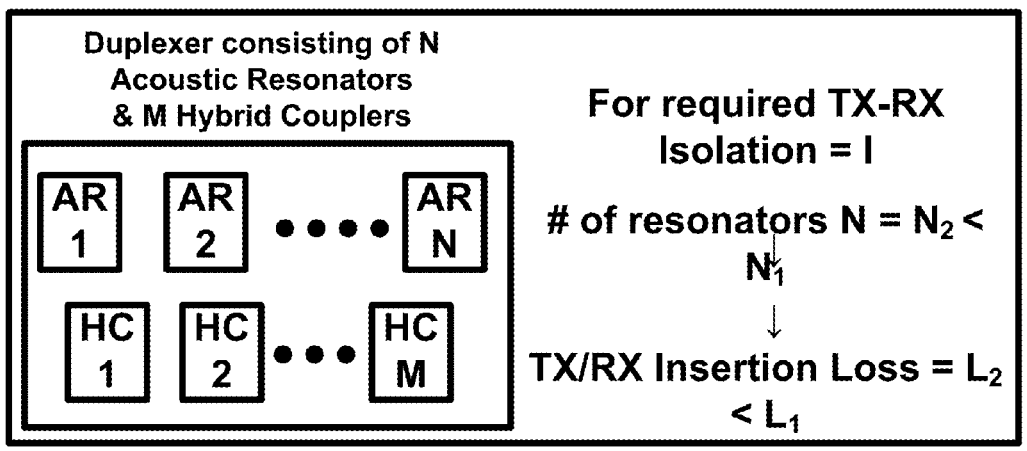
FIG. 1B illustrates a relaxed requirement for the minimum number of acoustic resonator needed in the duplexer design that incorporates two or more hybrid couplers (HC) to meet the certain transmitter (TX) to receiver (RX) isolation.

As shown in FIG. 1, for a given required isolation, by incorporating hybrid couplers in the design of duplexer, it may be possible to reduce the number of resonators used and hence the insertion loss of the duplexer in the TX and the RX band. For example, to achieve a TX to RX isolation of a particular amount using the conventional duplexer shown in FIG. 1A, $N_1$ acoustic resonators may be needed, some of which may be part of a TX filter and others of which may be part of a RX filter. Given the limited quality factor of the resonators, the duplexer insertion loss in the TX and RX bands may be given as $L_1$. If however, the design incorporate M (M≥2) hybrid couplers as shown in FIG. 1B, the total number of resonators use in the duplexer design may be $N_2$, which may be less than $N_1$. This may also result in a lower insertion loss, $L_2$, in the TX and the RX band compared to $L_1$.

Figure 2A:
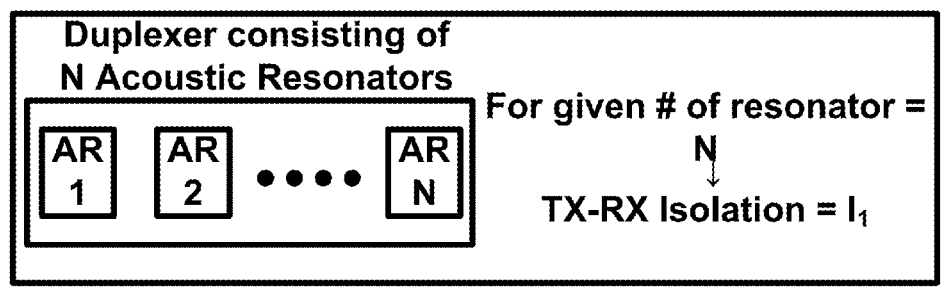
FIG. 2A illustrates a TX to RX isolation achieved when a certain number of acoustic resonator are used in a conventional duplexer design.
Figure 2B:
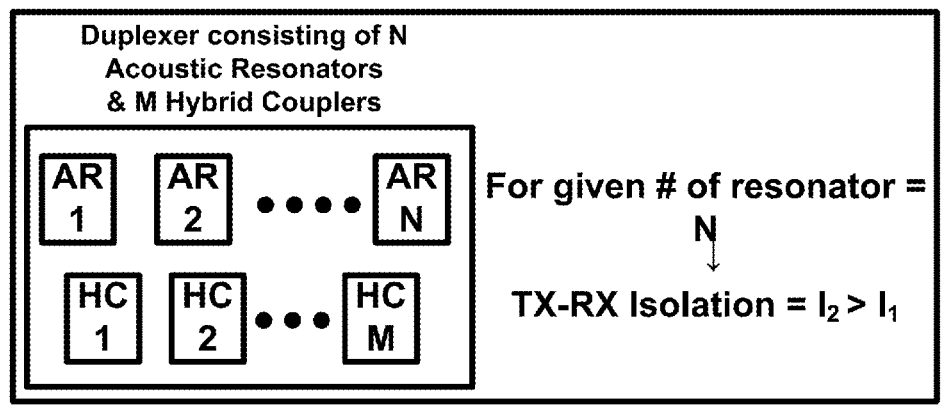
FIG. 2B illustrates a TX to RX isolation enhancement that may be achieved when a certain number of acoustic resonator are used in a hybrid coupler based duplexer.

Alternatively, as shown in FIG. 2, for a given number of acoustic resonators, it may be possible to enhance the isolation drastically by incorporating a hybrid coupler in the duplexer. For example, in the conventional duplexer design shown in FIG. 2A, if the total number of resonators use in the TX and RX filters is limited to N, the conventional duplexer may be able to achieve TX to RX isolation of only $I_1$. However, using N number of total resonators in the hybrid coupler based design using M (M≥2) hybrid couplers, as shown in shown in FIG. 2B, the duplexer may achieve a higher isolation of $I_2$ compared to $I_1$.

Figure 3A:
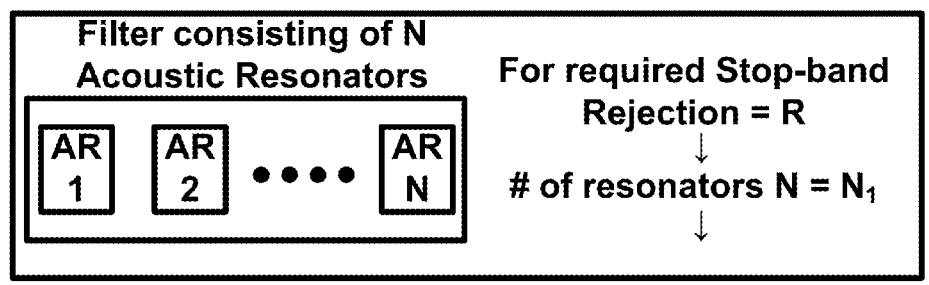
FIG. 3A illustrates a requirement for a minimum number of acoustic resonator that may be needed in a conventional filter to meet a certain stopband rejection.
Figure 3B:
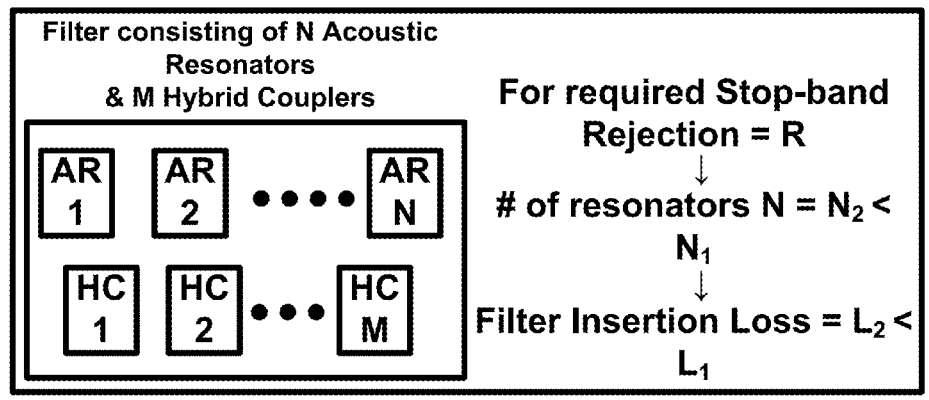
FIG. 3B illustrates a relaxed requirement for the minimum number of acoustic resonator that may be needed in the filter design and that incorporates one or more hybrid couplers to meet the certain stopband rejection.

Similarly, a certain stopband rejection in a filter may be achieved by using a smaller number of acoustic resonators, if one or more hybrid couplers are incorporated in the filter, as shown in FIG. 3B. To achieve a certain stop band rejection of R, the conventional filter design shown in shown in FIG. 3A may require the filter order to be at least $N_1$. Thus, the number of resonators that may have to be used in the conventional filter design may be at least $N_1$. This may result in the filter insertion loss of $I_1$ due to the limited quality factor of the resonators. On the other hand, incorporating M (M≥1) hybrid couplers in the design of the filter, as shown in FIG. 3B, may result in the stop rejection of R using a lower number of resonators $N_2$ compared to $N_1$. This means that using a hybrid coupler based design may have a lower insertion loss while achieving the same stopband rejection.

Figure 4A:
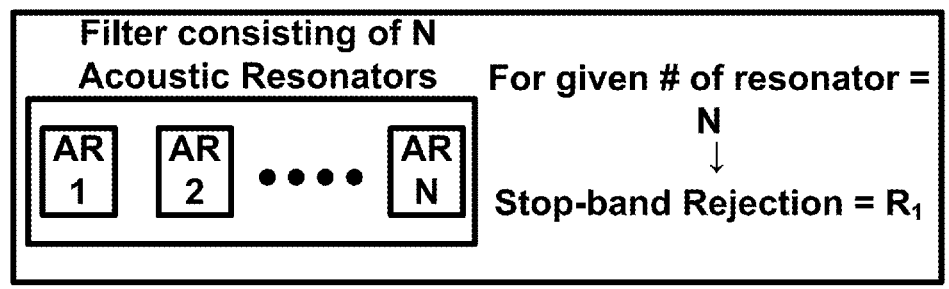
FIG. 4A illustrates a stopband rejection that may be achieved when a certain number of acoustic resonator are used in a conventional filter design.
Figure 4B:
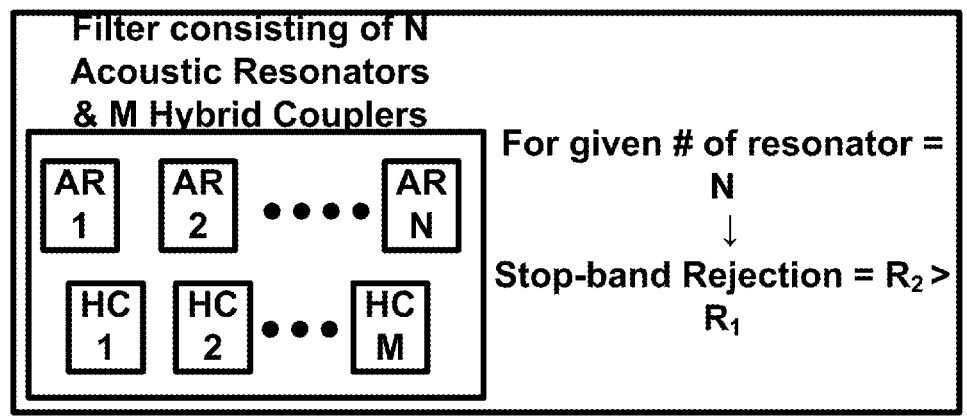
FIG. 4B illustrates a stopband rejection enhancement that may be achieved when a certain number of acoustic resonator are used in a hybrid coupler based filter.

Alternatively, for N number of resonators, a filter design incorporating M (M≥1) hybrid couplers, as shown in FIG. 4B, may have higher stopband rejection R2 compared to stopband rejection R1 achieved using the conventional filter design as shown in FIG. 4A.

FIG. 5B shows one embodiment of a hybrid coupler based duplexer. As shown in shown in FIG. 5A, a convention duplexer may connect an acoustic TX filter 501 and an acoustic RX filter 503, along with a matching network 505 at a common antenna (ANT) terminal 507. The TX to RX isolation in this case may be directly dependent on the number of resonators used in the TX and RX filters. On the other hand, the hybrid coupler based approach shown in shown in FIG. 5B may use feed-forward cancellation to achieve high isolation, while using a smaller number of acoustic resonators. A properly-designed hybrid-based cancellation network can provide isolation between certain combinations of ports, while allowing signal propagation between other combinations of ports.

In FIG. 5B, the intention is to isolate an RX port 513 and a TX port 515 while allowing signal propagation between an ANT 517 and the TX port 515, and also between the RX port 513 and the TX port 515. The remaining isolated port 519 of the hybrid-cancellation network may be terminated with a matched load 521. Two essentially identical two-port networks F1 and F2 may be placed between two hybrid couplers HC1 and HC2, and another two-port network F3 may be added at the RX port 513. The two-port network F3 may be a filter that passes the signals at the RX frequency band(s). Two port networks F1 and F2 may be filters that pass the signals at the TX frequency band(s). Each hybrid coupler may have four ports: an input port (In), a through port (T), a coupled port (C), and an isolated port (Iso). The signal entering the input port may split equally between the through port and the coupled port, and no signal may come out of the isolated port. The signals coming out of the through port and the coupled port may have quadrature phase shift with respect to each other corresponding to a quadrature hybrid (QH). Any of the four ports of the hybrid coupler may be used as an input port with the other ports appropriately reassigned.

As an illustrative conceptual example, both hybrid couplers may be ideal lossless quadrature hybrids. In this embodiment, the signal from the port RX after passing through the two-port network F3 may get split in two half because of the first hybrid coupler HC1, but with a 90° relative phase shift between the "T" and "C" ports. Each half may go two-port networks F1 and F2, and the two halves may combine again because of the second hybrid coupler HC2 at the TX port 515, but with an additional relative phase shift of 90°. Since the total phase shift in one half compared to the other half is 180°, the two halves may get cancelled after recombination.

On the other hand, the two halves of the signal from the RX port after passing through the two-port network F3 may see the same phase shift when they reach the terminated matched port 519 and hence combine constructively. Similarly, the two halves of the signal from the ANT port 517 may see the same phase shift when they reach the TX port 515 and hence also combine constructively. A portion of the two halves of the signal from the RX port 513 after passing through the two-port network F3 and after the first quadrature hybrid HC1, which are already 90° out-of-phase, may get reflected at the inputs of the two two-port networks F1 and F2, go through the first quadrature hybrid HC1, again experiencing another 90° phase shift relative to each other, and finally combine constructively at the ANT port 517.

When bandpass filters are used for F1, F2 and F3, the signal from the RX port 513 after filtering through the two-port network F3 with frequency lying in the passband of the filters F1 and F2 may transmit to the terminated matched port 519, while the signal from the RX port 513 after filtering through the two-port network F3 with frequency lying outside the passband of the filters F1 and F2 may transmit to the ANT port 517. Ideally, nothing may be transmitted to TX port 515. Similarly, the signal from the ANT port 517 with frequency lying in the passband of the filters F1 and F2 may transmit to the TX port 515, while the signal from the ANT port 517 with frequency lying outside the passband of the filters F1 and F2 may transmit to the RX port 513. Ideally, nothing may be transmitted to the terminated matched port 519. The roles of the TX port 515 and the RX port 513 may be reversed, while simultaneously modifying the frequency response of the filters, in an alternate scheme following a similar cancellation approach.

Isolation between the TX and RX ports, while allowing signal propagation between the RX and ANT ports, as well as the TX and ANT ports, may be desirable in many applications. For instance, in a wireless communication system, it may be desirable to isolate the receiver from the signal and noise of the transmitter while sharing an antenna between the transmitter and receiver. The receiver and transmitter need not be part of the same communication system. For instance, the transmitter and receiver may be part of different communication systems (including transmit only and receive only systems) within the same platform or in proximity to each other.

A duplexer using hybrid based cancellation may provide various desirable trade-offs. A conventional duplexer may require high order, usually $N_{TX} \geq 5$ and $N_{RX} \geq 5$, filters to achieve high (>50 dB) TX to RX isolation. Using a hybrid cancellation scheme, the filter order of F1, F2, and F3 ($N_{F1}$, $N_{F2}$, $N_{F3}$, respectively) can be reduced to two or three times, while achieving enhanced isolation by cancellation. The insertion loss of passive filters with lower order within the pass band may be lower compared with that of passive filters with higher order using components with similar quality factor as those of the lower order filter. The insertion loss of the passive filter within the pass band may be proportional to the order of the filter given that the quality factors of filter components do not exceed an upper limit.

Figure 6A:
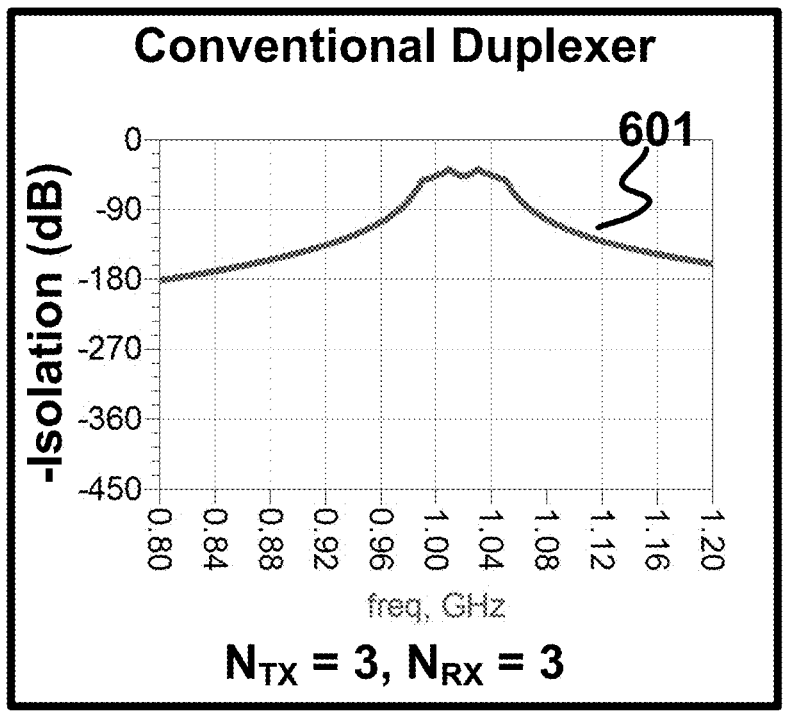
FIG. 6A shows an illustrative simulation showing an isolation that may be obtained using a conventional duplexer design.
Figure 6B:
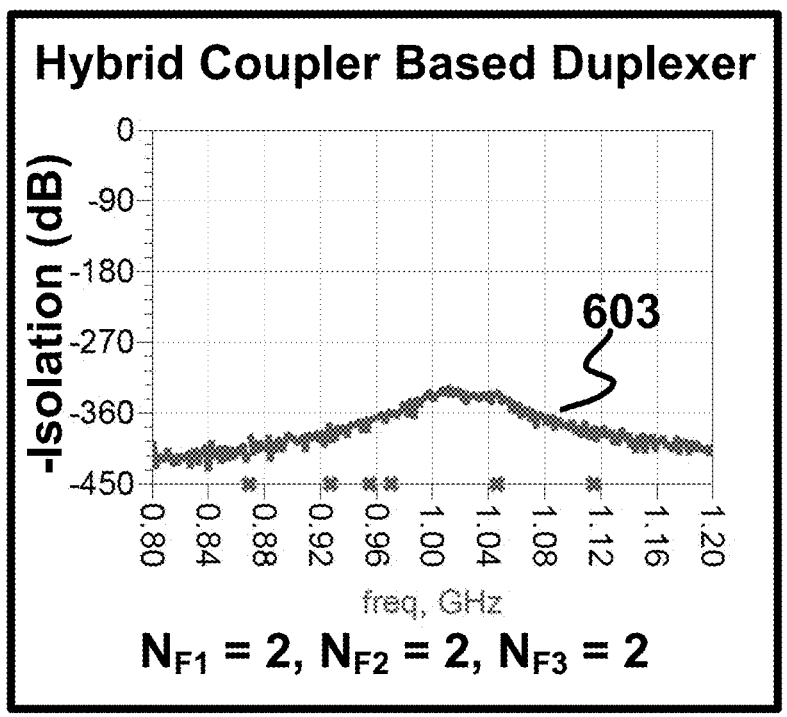
FIG. 6B shows an illustrative simulation showing an enhanced isolation that may be obtained using a hybrid coupler based duplexer.

FIGS. 6A and 6B show illustrative simulations highlighting the benefit of the hybrid coupler based approach of FIG. 5B. Using the principle of feedforward cancellation, the isolation can be significantly improved compared to a conventional filter. Using the conventional duplexer design of FIG. 5A with $N_{TX}=3$ and $N_{RX}=3$, the worst case TX to RX isolation 601 may be less than 40 dB, as shown in FIG. 6A. Using the hybrid coupler based duplexer design of FIG. 5B, but keeping the total number of resonators the same as in the design case of FIG. 6A, the TX to RX isolation 603 may be much larger than in the conventional filter.

Figure 7A:
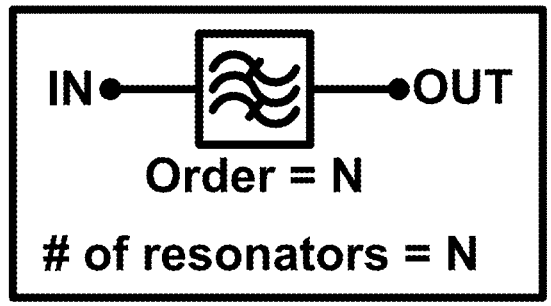
FIG. 7A shows an embodiment of a conventional filter design.
Figure 7B:
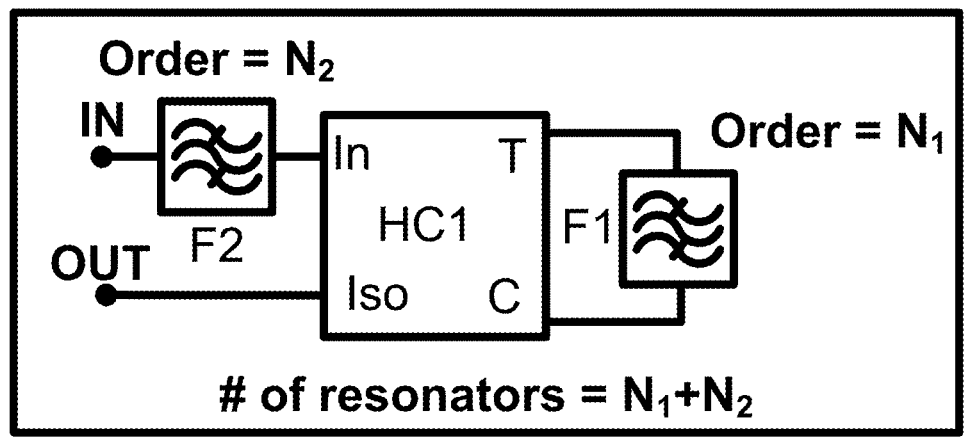
FIG. 7B shows an embodiment of a hybrid coupler based filter design which uses a reflective type filter to achieve enhanced stopband rejection determined by a passband of the filter F1.

FIG. 7B shows one embodiment of a filter using a hybrid coupler. In the particular, FIG. 7B illustrates two band pass filters used along with one hybrid coupler. If the hybrid coupler is an ideal quadrature hybrid coupler, the transfer function from input port (IN) to output port (OUT) may be written as:

$$S_{OUT,IN} = j^*(\tfrac{1}{2})^*(S_{11,F1}+S_{22,F1})^*(S_{21,F2})+(\tfrac{1}{2})^*(S_{21,F1}-S_{12,F1})^*(S_{21,F2}),$$

where $S_{xy}$ denotes the scattering matrix parameter between ports x and y, and "j" is the complex symbol equal to $\sqrt{-1}$ having unity magnitude and 90° phase shift. For instance, $S_{21,F1}$ corresponds to the $S_{21}$ of the two-port network F1 which may be a filter. If $S_{21,F1}$ and $S_{12,F1}$ of the two port network F1 are identical, for instance in a passive reciprocal two-port network, the transfer function between from IN to ISO may become:

$$S_{OUT,IN} = j^*(\tfrac{1}{2})^*(S_{11,F1}+S_{22,F1})^*(S_{21,F2})$$

The forward transfer function from the input to the output, namely $S_{OUT,IN}$, may depend on the reflection coefficients of the two-port network F1, namely $S_{11,F1}$ and $S_{22,F1}$ and the forward transfer function of the filter F2, namely $S_{21,F2}$. For instance, the reflection coefficients of the two-port network F1 may be chosen to have a band-stop response at a desired stop-band frequency and the forward transfer function of the two-port network F1 may be chosen to have a bandpass response at the desired passband frequency.

Figure 8A:
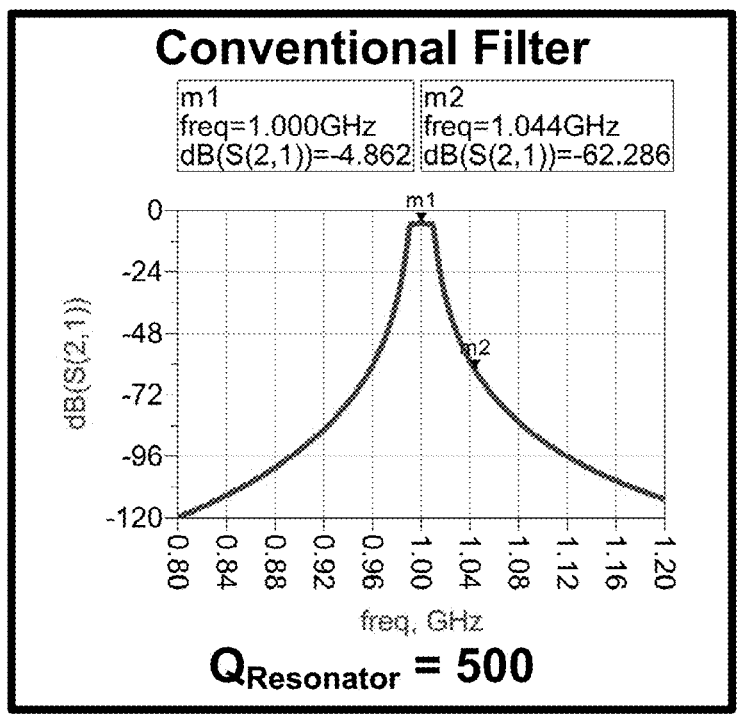
FIG. 8A shows an illustrative simulation showing a filter response obtained using a conventional duplexer design with limited quality factor (Q) resonators which may result in a large insertion loss in a passband of the filter.
Figure 8B:
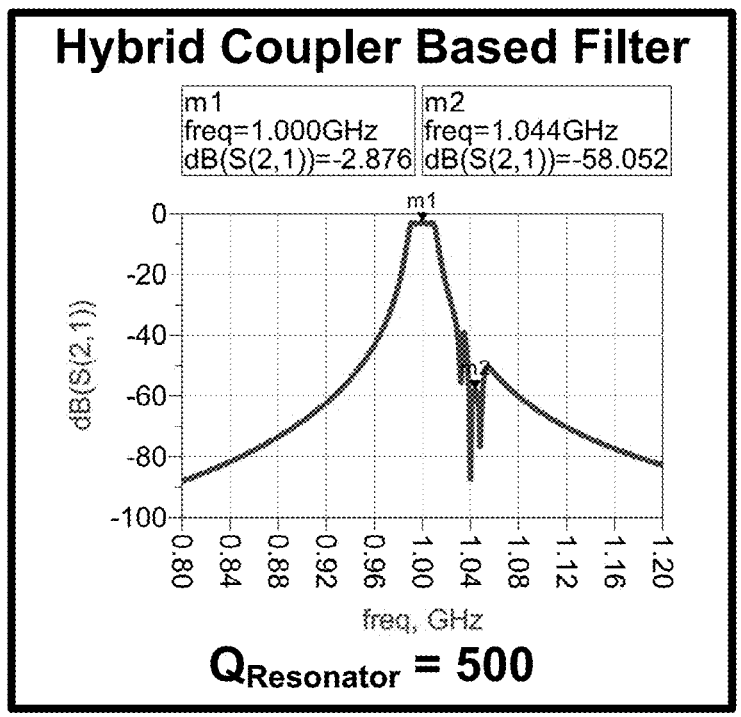
FIG. 8B shows an illustrative simulation showing a reduced insertion loss in a passband of a filter design using a hybrid coupler based approach which may achieve a rejection in a stopband as large as in the conventional filter.

A two-port network can be designed to have band-pass transfer functions between the two ports which will correspond to band-stop reflection coefficients at both ports. Then, for example, if this two-port network is used for F1, it may be possible to improve stopband rejection of the filter by aligning the passband of the filter F1 to the desired stopband. In the conventional filter design of FIG. 7A, the number of resonator may dictate the stopband rejection. Thus, even by using a smaller order for filters F1 and F2 in the approach of FIG. 7B compared to the conventional filter design, it may be possible to achieve a stopband rejection that is comparable to the conventional filter design using a large number of resonator. This means that the hybrid based approach may reduce the insertion loss in the passband of the filter, while achieving the same stopband rejection compared to the conventional case. FIG. 8B shows illustrative simulations highlighting the benefit of the hybrid coupler based approach of filter design of FIG. 7B. The desired stopband frequency may be 1.044 GHz and the desired passband frequency may be 1 GHz. If the conventional filter design of FIG. 7A is used, to achieve about 60 dB rejection in stopband, the filter order for this particular example has to be 4, which may result in a passband insertion loss of 4.862 dB, as shown in FIG. 8A. However, if a hybrid coupler based approach for filter design is used where the passband frequency of the two-port network F1 is kept at 1.044 GHz and the passband frequency of the two-port network F2 is kept at 1 GHz, the stopband rejection of about 60 dB may be obtained for a lower filter order for both two-port networks F1 and F2 than the one used in a conventional filter. This may result in a lower insertion loss of 2.876 dB in the passband of the hybrid coupler based filter, as shown in the example of FIG. 8B.

A hybrid coupler based filter may be very beneficial in coexistence scenarios where two or more wireless systems are present in close proximity and may be working simultaneously. Either of the wireless systems may use time division duplexing (TDD), where the wireless system's transmitter and receiver may not be simultaneously operating and may be connected to an antenna using a transmit-receive (T/R) switch, or either of the wireless systems may use frequency division duplexing (FDD) where the wireless system's transmitter and receiver may be simultaneously operating and may be connected to antenna using a duplexer, or either of the wireless systems may consist of only a receiver or only a transmitter. In all of these scenarios, one wireless system may interfere with the reception and transmission of the other wireless system when the wireless systems are in close proximity and work simultaneously. For example, a transmitted signal from the transmitter of a wireless system may be coupled to another wireless system and may degrade the performance or operation of this other wireless system. For instance, a transmitter signal from the transmitter of a wireless system may be coupled to the receiver of another wireless system and may reduce the sensitivity or selectivity of this receiver. For instance, a transmitter signal from the transmitter of a wireless system may be coupled to the transmitter of another wireless system and may cause instability or undesired behavior for this second transmitter.

The wireless system may be operating close to other non-wireless systems that may be generating signals that may be coupled to the wireless system and may degrade its performance. For instance, the wireless system may be operating close to microprocessors or digital signal processors (DSP) that generate high frequency signals that may be coupled to the wireless system in any number of mechanisms such as through the air, substrate, package, supply and ground connections, etc. For instance, the digital operation of a microprocessor or DSP may create signals that reduce the sensitivity or selectivity of a close-by wireless system or create instabilities or undesired behavior in the transmitter of a close-by wireless system.

Figure 9:
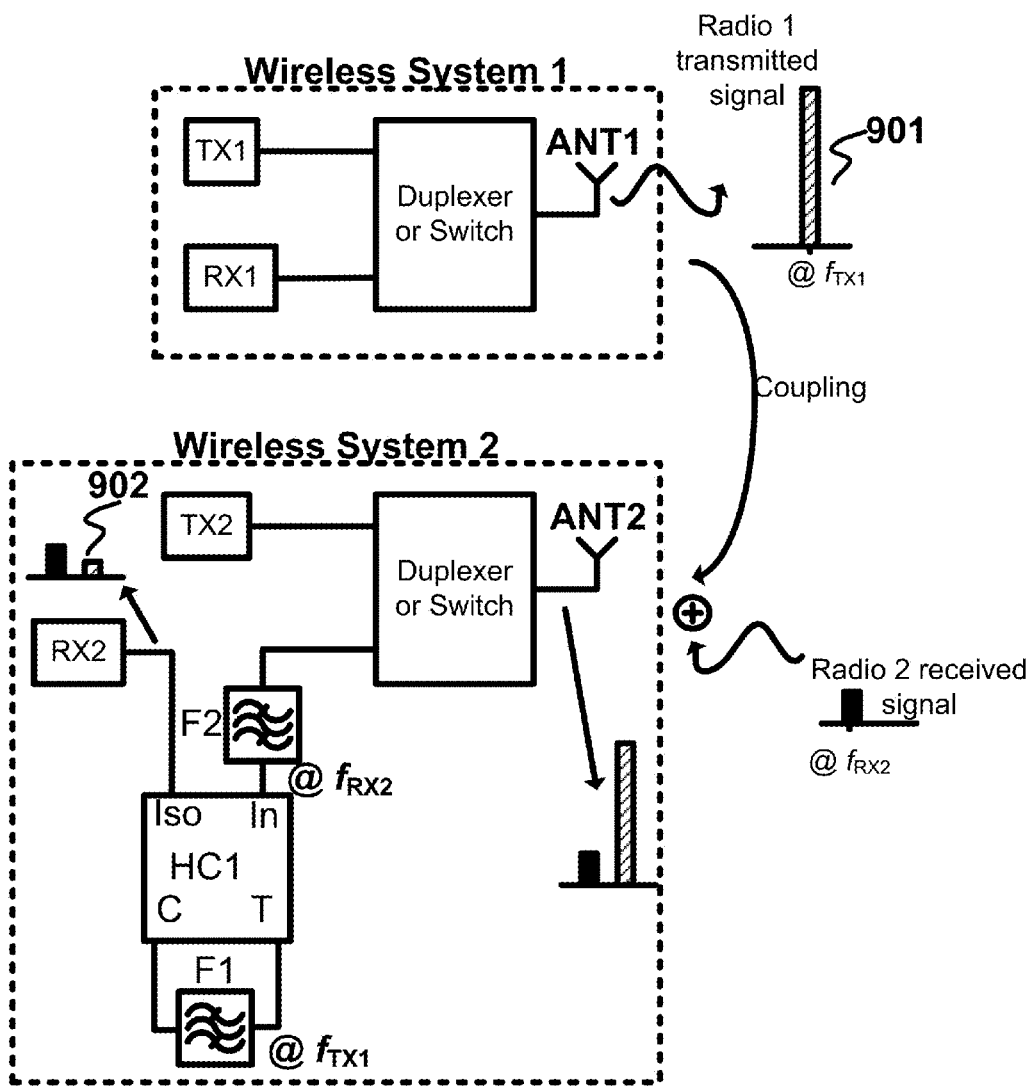
FIG. 9 illustrates use of a hybrid based filter in a co-existence scenario where two radios are located in close proximity and a transmitted signal of one radio degrades a received signal of the other radio.

To circumvent the aforementioned coexistence or unwanted coupling/leakage issues, for instance, the hybrid coupler based filter of FIG. 7B may be used at the receiver port of the wireless system 2 with the two-port network F1's passband frequency at the transmit frequency of the wireless system 1 ($f_{TX1}$) and with the two-port network F2's passband frequency at the receive frequency of the wireless system 2 ($f_{RX2}$). As shown in FIG. 9, due to the band stop response caused by the combination of hybrid coupler and the two-port network F1, the transmitted signal 901 from the wireless system 1 that may be coupled to the wireless system 2 may be strongly attenuated before reaching the receiver port 902 of the wireless system 2. Similarly, the transmitted signal 901 from the wireless system 1 may degrade the quality of the transmitted signal of the wireless system 2. As mentioned before, the source of the leakage signal shown as $f_{TX1}$, may be a microprocessor or DSP or any other building block, and the coupling mechanism may be through the air, substrate, package, supply and ground connections, etc. As mentioned before, either of the wireless systems may consist of only a receiver or a transmitter.

Figure 10A:
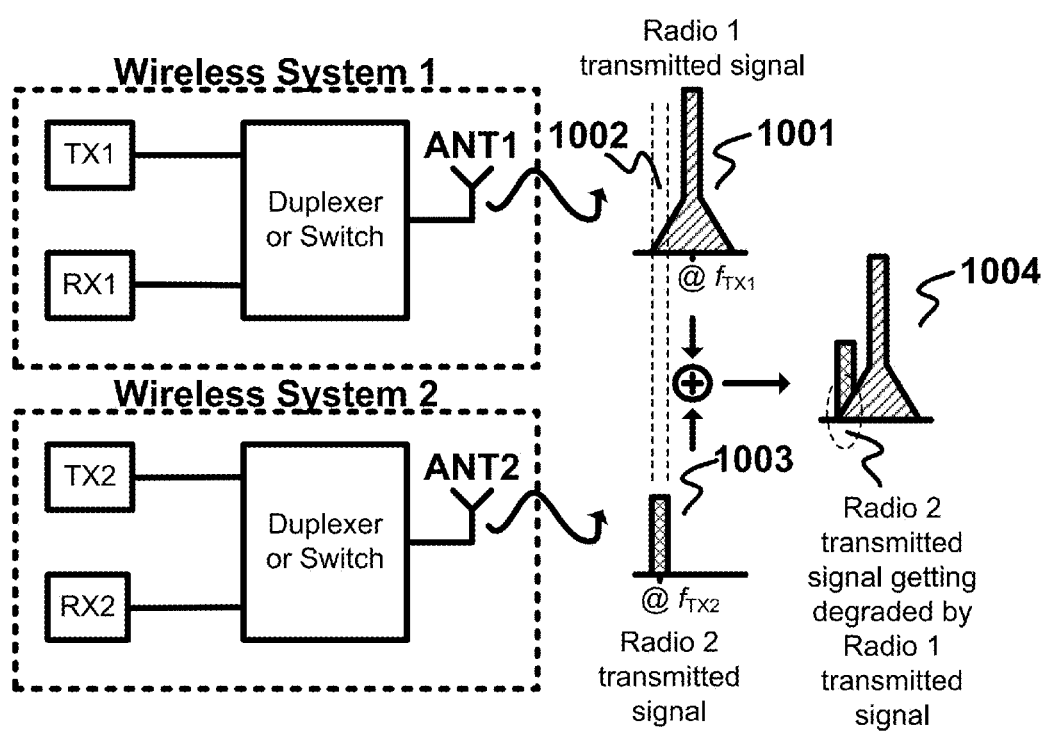
FIG. 10A illustrates a problem in a co-existence scenario where two radios are located in close proximity and a transmitted signal of one radio degrades a transmitted signal of another radio.

For example, and with reference to FIG. 10A, the non-linearity of the transmitter in the wireless system 1 may cause spectral regrowth of a transmitted signal 1001 in which a portion of the transmitted signal 1002 may lie in the transmission frequency band 1003 of the wireless system. Thus, after combining in air, the transmitted signal from wireless system 1 may degrade the quality of the wireless system's transmitted signal, as shown in 1004.

Figure 10B:
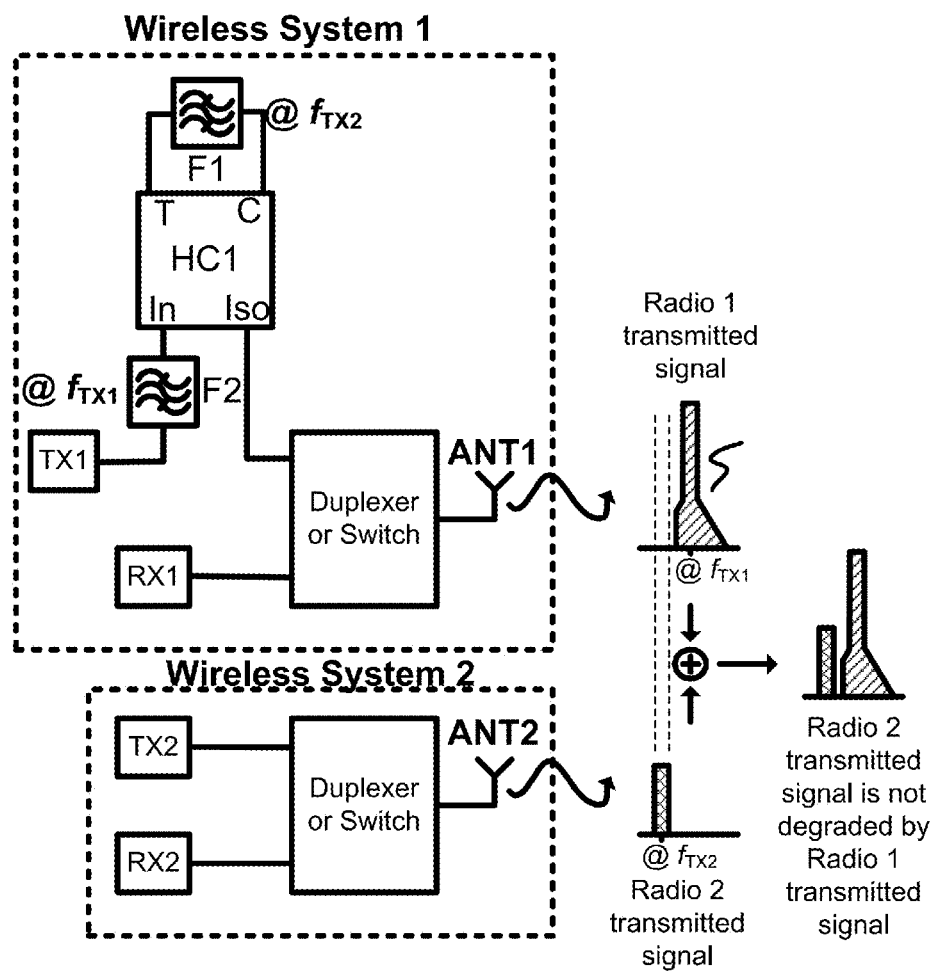
FIG. 10B illustrates use of a hybrid based filter in a co-existence scenario where two radios are located in close proximity and a transmitted signal of one radio degrades a transmitted signal of another radio.

To improve the quality of the transmission of wireless system 2, for example, the hybrid coupler based filter of FIG. 7B may be used at the transmit port of the wireless system 1 with F1's passband frequency at the transmit frequency of the wireless system 2 ($f_{TX2}$) and with F2's passband frequency at the transmit frequency of the wireless system 1 ($f_{TX1}$). As shown in FIG. 10B, due to the band stop response caused by the combination of hybrid coupler and F1, the portion of transmitted signal from the wireless system 1 at the transmit frequency band of the wireless system 2 may be strongly attenuated. Hence, after combining in the air, the transmitted signal of the wireless system 2 may not get degraded by the transmitted signal from the wireless system 1.

The configuration of the filters and the hybrid couplers in hybrid coupler based filters and duplexers need not be predetermined or fixed. For instance, the configuration of a filter may be reconfigurable. One representative example is a band-pass filter wherein the filter order can be reconfigured. Another representative example is to provide reconfigurability in the type of the filter, for instance, reconfigurability from a Butterworth-type filter to a Chebychev filter. The reconfigurability may be in response to external or internal stimuli. Reconfigurable circuits may be realized by incorporating one or more switches or other selection circuitry. For instance, mechanical switches or relays, electrical switches using diodes or transistors, micro electro mechanical (MEM) switches, or any combination of them may be used within a reconfigurable two-port network.

A reconfigurable filter and hybrid coupler may also have a tunable transfer function. For instance, the center frequency or bandwidth of a filter may be tunable. For instance, the shape of the transfer function may be modified in a reconfigurable approach. For instance, number and location of pass bands or stop bands may be reconfigured. Reconfigurable does not include changing components by unsoldering.

Figure 11A:
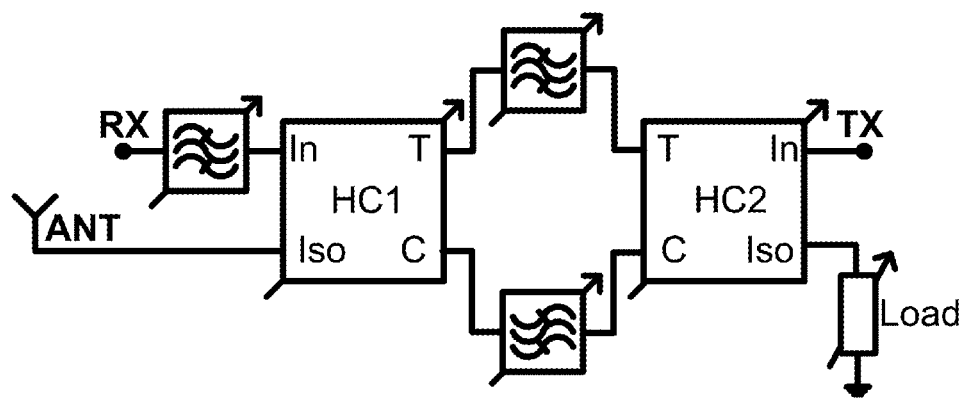
FIG. 11A illustrates an embodiment of the hybrid coupler based duplexer of FIG. 5B in which components of the duplexer may be individually reconfigurable or tunable.
Figure 11B:
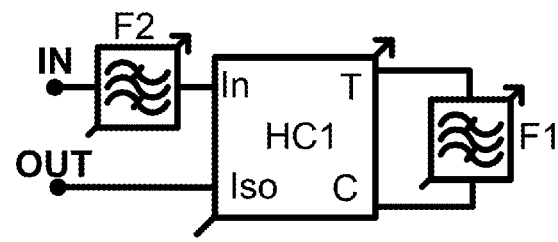
FIG. 11B illustrates an embodiment of the hybrid coupler based filter of FIG. 7B in which components of the filter may be individually reconfigurable or tunable.

FIGS. 11A and 11B shows illustrative embodiments of a reconfigurable duplexer and filter using hybrid couplers where one or more components in the filter and duplexer may be reconfigurable or tunable. For instance, in case of the reconfigurable duplexer shown in FIG. 11A, the TX to RX duplex distance that is the distance between the RX and TX frequency bands, the TX or RX passband bandwidths, and/or the TX and RX center frequencies may be tunable independently. Further, the shape and the order of the filters F1, F2, F3 may be reconfigurable. For instance, in the case of the reconfigurable filter shown in FIG. 11B, the passband response and the stopband response of the filter may be independently tunable by tuning F2 and F1, respectively. Further, the shape and the order of the filters F1 and F2 may be reconfigurable independently.

Additional filters and hybrid couplers may be added to obtain a desired frequency response for a duplexer or a filter. For instance, it may be desired to add multiple notches in the stopband of a filter to attenuate various unwanted signals that may be an input to the filter and that may be at different frequencies. Hence, it may be desirable to place notch responses at the frequencies of these unwanted signals. Multiple notches may also be used to extend the rejection or the bandwidth of frequency stop bands.

Figure 12:
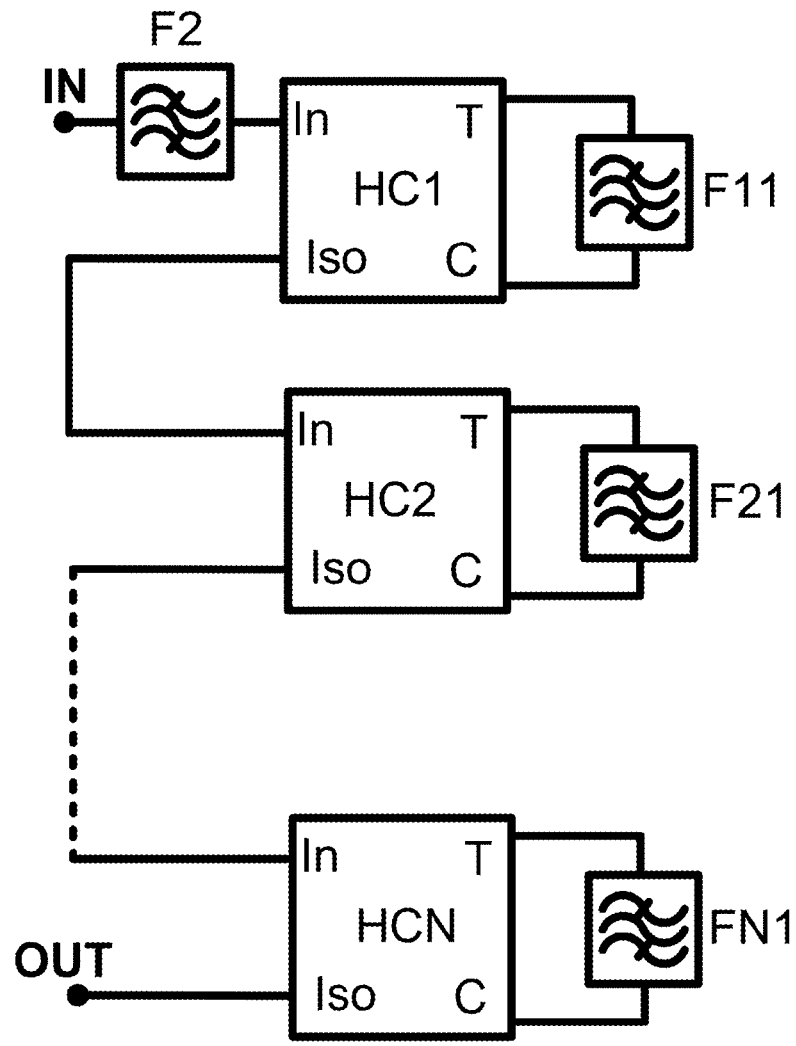
FIG. 12 illustrates an embodiment of a hybrid coupler based filter realized as a nested connection of multiple filters that are realized using the approach shown in FIG. 7B. Fixed as well as tunable/reconfigurable versions of this approach may be used.

FIG. 12 shows an embodiment of a hybrid coupler based filter which includes a nested connection of multiple hybrids and filters. The filter may include hybrid couplers HC1, HC2, . . . HCN and filters F11, F21, . . . FN1 and F2. For instance, the passband frequency of filters F11, F21, . . . FN1 may be chosen to align with the frequency of various unwanted signals, and the passband frequency of filter F2 may be chosen to align with the desired passband of the composite filter. The order of this nested hybrid coupler based filter can be increased by adding more units in series. The Iso and the In ports of the hybrid couplers HC1, HC2, . . . HCN may have additional filters connected to them. Fixed, as well as tunable or reconfigurable versions of this approach may be used.

Figure 13:
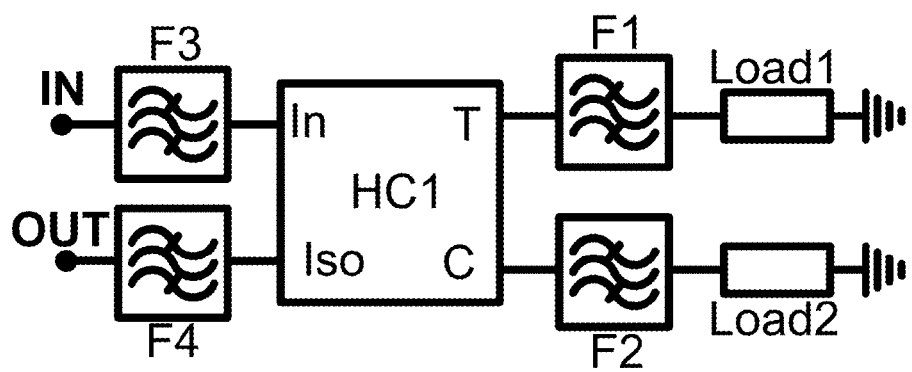
FIG. 13 shows another embodiment of a hybrid coupler based filter design which uses a reflective type filter to achieve enhanced stopband rejection determined by a passband of filters F1 and F2.

FIG. 13 illustrates an embodiment of a tunable/reconfigurable reflection-type filter realized by terminating a through (T) port and a coupled (C) port of a tunable/reconfigurable hybrid coupler HC1 with two tunable/reconfigurable filters F1 and F2 and their associated tunable/reconfigurable loads. Two other tunable/reconfigurable filters F3 and F4 may be placed in series with an input (In) and isolated (Iso) ports of the tunable/reconfigurable hybrid coupler and the tunable/reconfigurable two-port reflection type filter ports.

A tunable/reconfigurable response may be realized when the hybrid coupler HC1 and/or one or more of the filters F3, F4, F1, F2, or their associated loads is tunable/reconfigurable. For instance, the two-port networks F1, F2, F3, and F4 may be designed in such a way that the overall transfer function has one or more passbands at certain frequencies and one or more stopbands at other certain frequencies. The transfer functions or the reflection coefficients of the filters F1, F2, F3, and F4 may be tunable/reconfigurable so that the overall transfer function of the new two-port network is also tunable/reconfigurable. Other embodiments of this approach may not include the filters F3 or F4. Nested connection of the multiple filters of FIG. 13 may also be possible, similar to the filter of FIG. 12 where the unit filter may not include the filters F3 or F4.

While the specific illustrations show filters in a hybrid coupler based duplexer and a hybrid coupler based filter with a single passband, the teachings of this disclosure are applicable to cases where these filters may have multiple passbands. Applications may include carrier aggregation, multi-band operation, multi-mode operation, or multi-standard operation. In these cases, some or all of the components of the hybrid coupler based duplexer and filter may be designed to include multiple passbands.

Packaging approaches may be used to create a foot-print compatible or improved solution with the conventional filters or duplexers. For instance, the filters F1, F2 and F3 of FIG. 5B may use fewer acoustic resonators or filters with lower order when compared with conventional acoustic filters or duplexers.

Figure 14A:
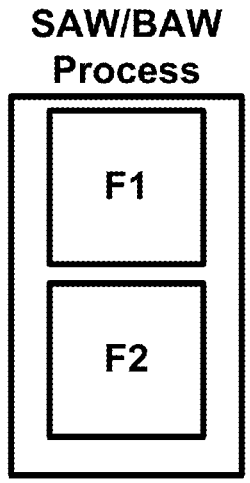
FIG. 14A illustrates an integration approach where one or more filters in a hybrid coupler based duplexer or filter may be integrated in one surface acoustic wave (SAW) or bulk acoustic wave (BAW) process.
Figure 14B:
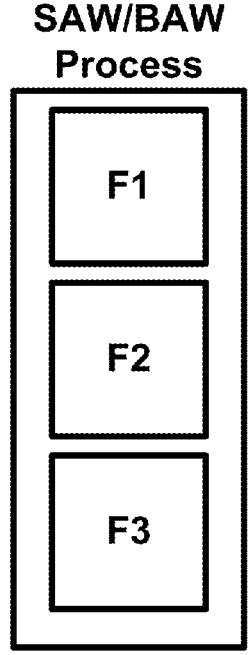
FIG. 14B illustrates an integration approach where all filters in a hybrid coupler based duplexer or filter may be integrated in one surface acoustic wave (SAW) or bulk acoustic wave (BAW) process.
Figure 14C:
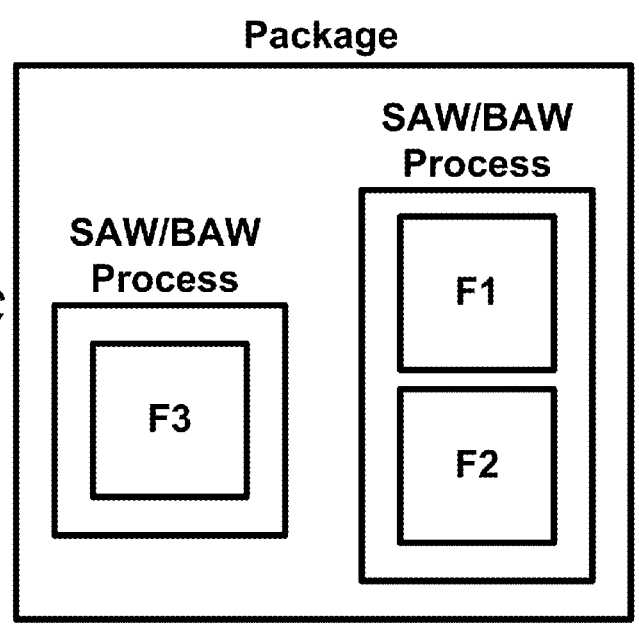
FIG. 14C illustrates an integration approach where one or more filters in a hybrid coupler based duplexer or filter may be co-packaged with other filters in the hybrid coupler based duplexer or filter.

The filters F1 and F2 may be on the same die to achieve good matching between them, as shown in FIG. 14A. Good matching may be very useful to obtain high isolation which may depend on the amount of mismatch in the main and the cancellation paths of the hybrid cancellation scheme in FIG. 5B. Furthermore, F1, F2 and F3 may be on the same die to reduce foot-print or cost or temperature difference among them, as shown in FIG. 14B. Alternatively, the filters F1, F2, and F3 may be on different dies but co-packaged as shown in FIG. 14C. In this scheme, an appropriate process may be chosen for the F1, F2 and F3 based on performance and economic considerations. Various packaging technologies may be used. For instance, wafer scale packaging may be chosen to minimize the footprint. Similarly, for instance, the filters F1 and F2 of the hybrid coupler based filter of FIG. 7B may be on same die or different die, but co-packaged.

Figure 15:
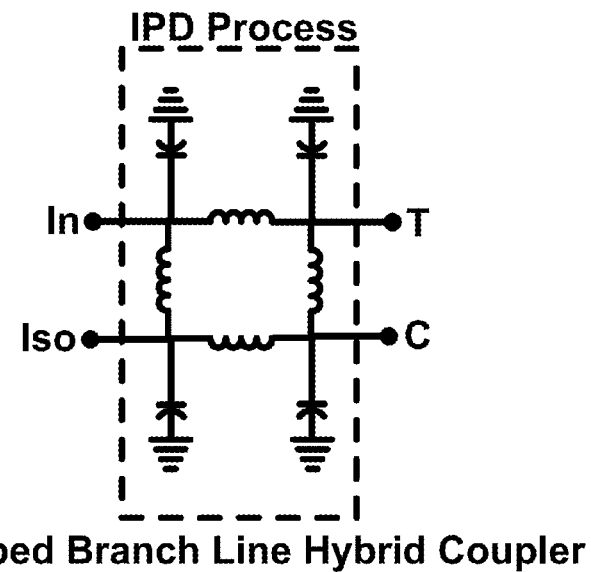
FIG. 15 illustrates a lumped element embodiment of a hybrid coupler where the lumped elements, such inductors and capacitors, may be integrated in an integrated passive device (IPD) process.

The other passive devices, for instance, the hybrid couplers HC1 and HC2 of FIG. 5B and the hybrid coupler HC1 of FIG. 7B, may be implemented on an integrated passive device (IPD) or integrated on a common substrate, such as a low-temperature co-fired ceramic (LTCC) substrate. For instance, the hybrid coupler may be implemented as a lumped hybrid coupler using lumped components, such as inductors and capacitors fabricated in an IPD process. One embodiment is shown in FIG. 15. It uses a lumped implementation of a branch-line hybrid coupler. The hybrid couplers may be implemented as a distributed hybrid coupler, such as one that uses transmission lines. Wider band implementation of hybrid couplers, such as a Lange hybrid coupler, may be used, depending on the bandwidth requirement.

Figure 16A:
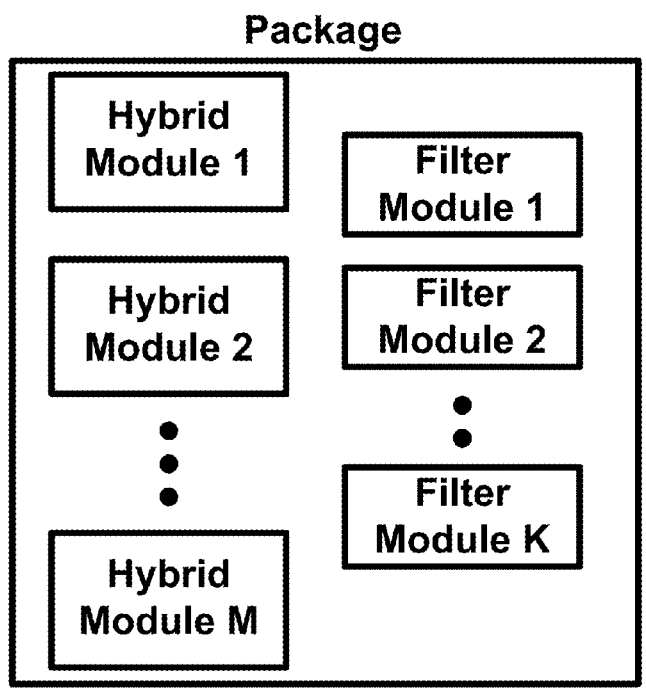
FIG. 16A illustrates an integration approach where one or more hybrid modules are co-packaged with one or more filter modules with each hybrid module including one or more hybrid couplers and each filter module including one or more filters which may be implemented in an IPD and an SAW/BAW process, respectively.
Figure 16B:
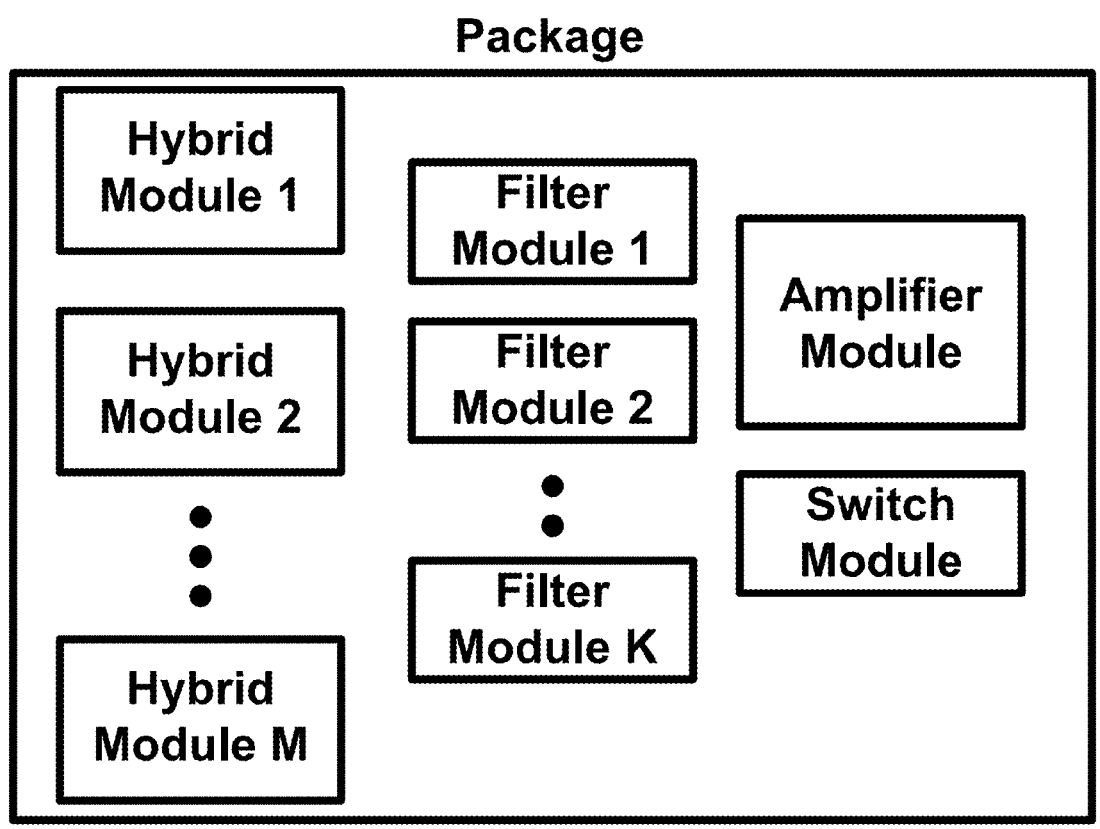
FIG. 16B illustrates an integration approach where one or more hybrid modules and one or more filter modules are co-packaged with a power-amplifier module or a switch module.

The hybrid couplers and the filters of the hybrid based duplexer and filter may be co-packaged. For instance, and as shown in FIG. 16A, one or more hybrid coupler modules may be integrated inside one package with one or more filter modules. Each hybrid module may contain one or more hybrid couplers. Each filter module may contain one or more resonators or filters. Each hybrid module may use an IPD process and each filter may use SAW or BAW resonators. Furthermore, and as shown in FIG. 16B, the filter and hybrid coupler modules may be co-packaged along with an amplifier or a switch module, each including one or amplifiers and switches, respectively. Amplifiers may consist of power amplifiers (PA), low noise amplifiers (LNA), or other radio frequency (RF) amplifiers. The module may consist of one or more hybrid coupler, one or more filters that use acoustic resonators, one or more switches, and one or more amplifiers which may be LNA, PA, or other RF amplifiers.

Figure 17A:
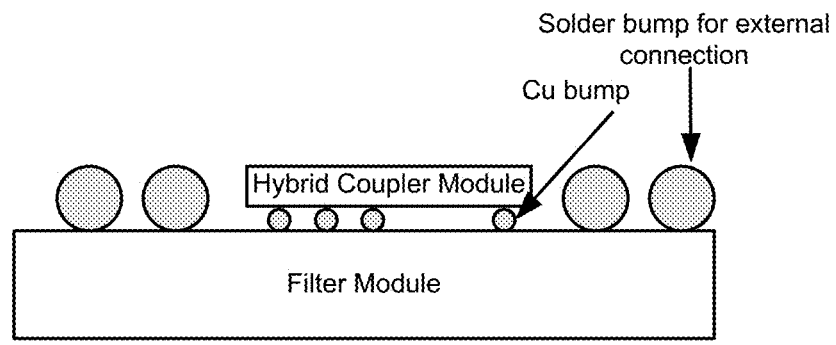
FIG. 17A illustrates an integration approach where a hybrid module is stacked on top of a filter module.
Figure 17B:
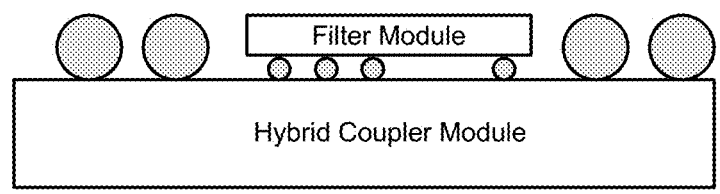
FIG. 17B illustrates an integration approach where a filter module is stacked on top of a hybrid module.
Figure 17C:
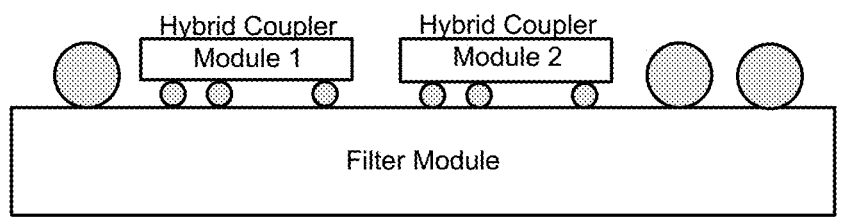
FIG. 17C illustrates an integration approach where one or more hybrid modules are stacked on top of a filter module.
Figure 17D:
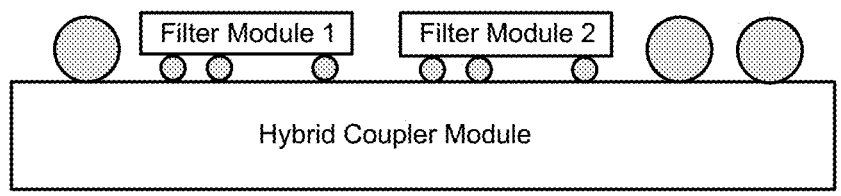
FIG. 17D illustrates an integration approach where one or more filter modules are stacked on top of a hybrid module.

The filter modules and the hybrid module may be stacked to create a small foot-print and a good electrical connection. 2.5D/3D die stacking may be used. For example, and as shown in FIG. 17A, a hybrid coupler module may be stacked on top of a filter module, the two modules may be connected using copper bumps, and solder bumps may be used for external connections. Alternatively, the filter module may be stacked on top of the hybrid module, as shown in FIG. 17B. More than one hybrid module may be stacked on top of one filter module, as shown in FIG. 17C, or two or more filter modules may be stacked on top of one hybrid module, as shown in FIG. 17D. The stacked hybrid coupler and the filter module may be stacked or co-packaged with the amplifier or switch modules. In all the schemes, through wafer via, wire bonds, or solder bumps may be used for electrical connections.

In an alternate approach, the hybrids and the filters may share the same substrate. For example, the hybrids and filters may all be implemented in an IPD process.

The fourth port of the hybrid cancellation scheme of FIG. 5B may be terminated on the IPD, with a desired load, which may be fully passive having an impedance with a real part and an imaginary part. There may be other passive components, such as phase shifters and attenuators, in the main and cancellation paths of the hybrid cancellation scheme in FIG. 5B. This may be used to improve matching and/or to reduce the reflection coefficient of various ports, which in turn may result in higher TX to RX isolation. These additional passive components may be part of the hybrid module. Similarly, the loads Load1 and Load2 in the hybrid filter scheme of FIG. 13 may be integrated with the hybrid coupler in an IPD process.

Various factors may be considered in the design, including but not limited to cost, complexity of manufacturing, final form factor, including height and footprint, thermal expansion matching coefficient, heat dissipation capability, and/or electrical performance.

The components, steps, features, objects, benefits and advantages which have been discussed are merely illustrative. None of them, nor the discussions relating to them, are intended to limit the scope of protection in any way. Numerous other embodiments are also contemplated. These include embodiments which have fewer, additional, and/or different components, steps, features, objects, benefits and advantages. These also include embodiments in which the components and/or steps are arranged and/or ordered differently.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

All articles, patents, patent applications, and other publications that have been cited in this disclosure are incorporated herein by reference.

The phrase "means for" when used in a claim is intended to and should be interpreted to embrace the corresponding structures and materials that have been described and their equivalents. Similarly, the phrase "step for" when used in a claim is intended to and should be interpreted to embrace the corresponding acts that have been described and their equivalents. The absence of these phrases from a claim means that the claim is not intended to and should not be interpreted to be limited to these corresponding structures, materials, or acts, or to their equivalents.

The scope of protection is limited solely by the claims that now follow. That scope is intended and should be interpreted to be as broad as is consistent with the ordinary meaning of the language that is used in the claims when interpreted in light of this specification and the prosecution history that follows, except where specific meanings have been set forth, and to encompass all structural and functional equivalents.

Relational terms such as "first" and "second" and the like may be used solely to distinguish one entity or action from another, without necessarily requiring or implying any actual relationship or order between them. The terms "comprises," "comprising," and any other variation thereof when used in connection with a list of elements in the specification or claims are intended to indicate that the list is not exclusive and that other elements may be included. Similarly, an element preceded by an "a" or an "an" does not, without further constraints, preclude the existence of additional elements of the identical type.

None of the claims are intended to embrace subject matter that fails to satisfy the requirement of Sections 101, 102, or 103 of the Patent Act, nor should they be interpreted in such a way. Any unintended coverage of such subject matter is hereby disclaimed. Except as just stated in this paragraph, nothing that has been stated or illustrated is intended or should be interpreted to cause a dedication of any component, step, feature, object, benefit, advantage, or equivalent to the public, regardless of whether it is or is not recited in the claims. The abstract is provided to help the reader quickly ascertain the nature of the technical disclosure. It is submitted with the understanding that it will not be used to interpret or limit the scope or meaning of the claims. In addition, various features in the foregoing detailed description are grouped together in various embodiments to streamline the disclosure. This method of disclosure should not be interpreted as requiring claimed embodiments to require more features than are expressly recited in each claim. Rather, as the following claims reflect, inventive subject matter lies in less than all features of a single disclosed embodiment. Thus, the following claims are hereby incorporated into the detailed description, with each claim standing on its own as separately claimed subject matter.

The invention claimed is:

1. A radio frequency filter comprising:
   a first port and a second port;
   a hybrid coupler having an input port ("In"), a through port ("T"), a coupled port ("C"), and an isolated port ("Iso");
   two acoustic bandpass filters;
   wherein
   one of the acoustic bandpass filters is coupled to ports "T" and "C" of the hybrid coupler such that only one acoustic filter is coupled to ports "T" and "C" of the hybrid coupler;
   the other of the two acoustic bandpass filters is coupled to port "In" of the hybrid coupler and the first port;
   the second port is coupled to the port "Iso" of the hybrid coupler;
   the hybrid coupler is an integrated passive device; and
   the acoustic filters and the hybrid coupler are co-packaged in a stacked configuration wherein one of the two acoustic bandpass filters has a passband that corresponds to transmit frequency bands of a wireless communication system, and the other of the two acoustic bandpass filters has a passband that corresponds to receive frequency bands of the wireless communication system.

2. The radio frequency filter of claim 1 wherein the two acoustic bandpass filters are in a common wafer.

3. The radio frequency filter of claim 1 wherein the two acoustic bandpass filters are surface acoustic wave filters.

4. The radio frequency filter of claim 1 wherein the two acoustic bandpass filters are acoustic wave filters.

5. A radio frequency duplexer with a transmit frequency band or bands and a receive frequency band or bands comprising:
  two hybrid couplers;
  two essentially identical acoustic filters; and
  a third acoustic filter;
  wherein
    the two essentially identical acoustic filters have a passband that includes the transmit frequency bands and a stopband that includes the receive frequency bands;
    the third acoustic filter has a passband that includes all of the receive frequency bands and a stopband that includes all of the transmit frequency bands;
    each of the two essentially identical acoustic filters is coupled to both of the two hybrid couplers;
    the third acoustic filter is coupled to one of the two hybrid couplers;
    the hybrid couplers are integrated passive devices; and
    the two essentially identical acoustic filters and the third acoustic filter and hybrid couplers are co-packaged in a stacked configuration wherein at least one of the two essentially identical acoustic filters or the third acoustic filter is reconfigurable to reconfigure filter order or the type of filter.

6. The radio frequency duplexer of claim 5 wherein the two essentially identical acoustic filters are in a common wafer.

7. The radio frequency duplexer of claim 5 wherein the two essentially identical acoustic filters are surface acoustic wave filters or wherein the third acoustic filter is a surface acoustic wave filter.

8. The radio frequency duplexer of claim 5 wherein the two essentially identical acoustic filters are bulk acoustic wave filters or wherein the third acoustic filter is a bulk acoustic wave filter.

9. A radio frequency duplexer with one or more transmit frequency bands and one or more receive frequency bands comprising:
  two hybrid couplers;
  two essentially identical acoustic filters; and
  a third acoustic filter;
  wherein
    the two essentially identical acoustic filters have a passband that includes all of the receive frequency bands and a stopband that includes all of the transmit frequency bands;
    the third acoustic filter has a passband that includes all of the transmit frequency bands and a stopband that includes all of the receive frequency bands;
    each of the two essentially identical acoustic filters is coupled to both of the two hybrid couplers;
    the third acoustic filter is coupled to one of the two hybrid couplers;
    the hybrid couplers are integrated passive devices; and
    the two essentially identical acoustic filters and the third acoustic filter and hybrid couplers are co-packaged in a stacked configuration wherein at least one of the two essentially identical acoustic filters or the third acoustic filter is reconfigurable to reconfigure filter order or the type of filter.

10. The radio frequency duplexer of claim 9 wherein the two essentially identical acoustic filters are in a common wafer.

11. The radio frequency duplexer of claim 9 wherein the two essentially identical acoustic filters are surface acoustic wave filters or the third acoustic filter is a surface acoustic wave filter.

12. The radio frequency duplexer of claim 9 wherein the two essentially identical acoustic filters are bulk acoustic wave filters or wherein the third acoustic filter is a bulk acoustic wave filter.

13. The radio frequency filter of claim 1 wherein the two acoustic bandpass filters have 2 or less resonators.

14. The radio frequency duplexer of claim 9 wherein at least one of the two essentially identical acoustic filters or the third acoustic filter is reconfigurable from a Butterworth-type filter to a Chebychev filter.

15. The radio frequency duplexer of claim 9 wherein the two essentially identical acoustic filters are reconfigurable to reconfigure filter order or the type of filter.

16. The radio frequency duplexer of claim 9 wherein the two essentially identical acoustic filters and or the third acoustic filter are reconfigurable to reconfigure filter order or the type of filter.

17. The radio frequency duplexer of claim 5 wherein at least one of the two essentially identical acoustic filters or the third acoustic filter is reconfigurable from a Butterworth-type filter to a Chebychev filter.

18. The radio frequency duplexer of claim 5 wherein the two essentially identical acoustic filters are reconfigurable to reconfigure filter order or the type of filter.

19. The radio frequency duplexer of claim 5 wherein the two essentially identical acoustic filters and or the third acoustic filter are reconfigurable to reconfigure filter order or the type of filter.

* * * * *